US007486067B2

(12) United States Patent
Bossche

(10) Patent No.: US 7,486,067 B2
(45) Date of Patent: Feb. 3, 2009

(54) REAL-TIME DEVICE CHARACTERIZATION AND ANALYSIS

(75) Inventor: Marc Vanden Bossche, Bornem (BE)

(73) Assignee: NMDG NV, Bornem (BE)

( * ) Notice: Subject to any disclaimer, the term of this patent is extended or adjusted under 35 U.S.C. 154(b) by 0 days.

(21) Appl. No.: 11/635,734

(22) Filed: Dec. 7, 2006

(65) Prior Publication Data

US 2007/0194776 A1 Aug. 23, 2007

Related U.S. Application Data

(63) Continuation of application No. PCT/BE2005/000093, filed on Jun. 7, 2005.

(60) Provisional application No. 60/577,534, filed on Jun. 7, 2004.

(51) Int. Cl.
*G01R 23/16* (2006.01)
*G01R 23/00* (2006.01)

(52) U.S. Cl. .......................................... 324/76.22; 330/2

(58) Field of Classification Search .............. 324/76.22; 330/2, 305
See application file for complete search history.

(56) References Cited

U.S. PATENT DOCUMENTS 4,816,767 A * 3/1989 Cannon et al. ........... 324/76.19
5,336,988 A * 8/1994 Chmielewski et al. ... 324/76.19
6,297,649 B1 * 10/2001 Tsironis ...................... 324/642
6,348,804 B1 2/2002 Evers
6,509,743 B1 1/2003 Ferrero
6,636,816 B1 * 10/2003 Dvorak et al. ............ 324/76.41
6,812,714 B2 11/2004 Verspecht
6,943,561 B2 * 9/2005 Verspecht ................... 324/603
6,970,000 B2 11/2005 Evers
7,038,468 B2 * 5/2006 Verspecht ................ 324/76.19
7,248,866 B1 * 7/2007 Tsironis ...................... 324/642
2002/0196033 A1 * 12/2002 Martens ...................... 324/612
2003/0057964 A1 * 3/2003 Verspecht ................... 324/603
2003/0058058 A1 3/2003 Verspecht
2004/0066182 A1 4/2004 Verspecht

FOREIGN PATENT DOCUMENTS

GB 2336438 A 10/1999
WO WO 03/048791 A2 6/2003

OTHER PUBLICATIONS

Calibration of a Measurement System for High-frequency Non-Linear Devices, J.Verspecht, Ph.D thesis, Free University of Brussels, 1995, pp. 13-36.
Verspecht J. et al.: Large-Signal Measurements "Going beyond S-parameters . . . ", Notes of the ARFTG Short Course Nov. 2000, pp. 1,18, 44,53.

(Continued)

*Primary Examiner*—Timothy J Dole
(74) *Attorney, Agent, or Firm*—Knobbe Martens Olson & Bear LLP

(57) ABSTRACT

A measurement system for determining at least one characteristic of a device under test (DUT) at at least one frequency is described. The measurement system includes a network analyzer being in connection at least with a first source via a first connector and a second source via a second connector. Each source generates a signal. The network analyzer further includes signal paths arranged for applying the generated signals to the DUT and arranged for receiving signals output by the DUT. The frequency content of the signal generated by the second source includes at least a frequency component offset from the at least one frequency at which the DUT is characterized, the at least one frequency being included in the frequency content of the signal generated by the first source.

20 Claims, 21 Drawing Sheets

OTHER PUBLICATIONS

Zanden, van der K. et al.: 'Reliability Testing of InP HEMT's Using Electrical Stress Methods', IEEE Transactions on Electron Devices, IEEE Service Center, vol. 46, No. 8, Aug. 1999, pp. 1570-1576.

Williams D J; Leckey J; Tasker P J: 'A Study of the Effect of Envelope Impedance on Intermodulation Asymmetry Using a Two-Tone Time Domain Measurement System', 2002 IEEE MTT-S International Microwave Symposium Digest.(IMS 2002). Seattle, WA, Jun. 2-7, 2002, IEEE MTT-S International Microwave Symposium, New York vol. 3, No. 3, 2002, pp. 1841-1844.

Schreurs D. et al: 'Easy and accurate empirical transistor model parameter estimation from vectorial large-signal measurements', Microwave Symposium Digest vol. 2, Jun. 13, 1999, pp. 753-756.

Schreurs D. et al: 'Straightforward and accurate nonlinear device model parameter-estimation method based on vectorial large-signal measurements', IEEE Transactions on Microwave Theory and Techniques vol. 50, No. 10, Oct. 10, 2002, pp. 2315-2319.

Verspecht J.: 'Everything you've always wanted to know about "Hot-S 22" (but were afraid to ask)', International Microwave Symposium 2002, Jun. 2002, pp. 1-21.

Verspecht J. et al: 'Black Box Modelling of Power transistors in the Frequency domain', Conference Record of the INMMC 1996 Workshop 1996, Duisburg, pp. 1-6.

Williams D J; Tasker P J: 'An automated active source and load pull measurement system', High Frequency Postgraduate Student Colloquium Sep. 9, 2001, pp. 7-12.

* cited by examiner 15
12
$f_0$
$a_1(t)$
$b_1(t)$
10
$a_2(t)$
$b_2(t)$
16
13
$f_0$+df
or
$Z_l(k\,f_0) = A_2(k\,f_0) / B_2(k\,f_0)$ $Z_l(f_0,t)$ with injection at $f_0$+df $Z_l(f_0,t) = A_2(f_0,t) / B_2(f_0,t)$

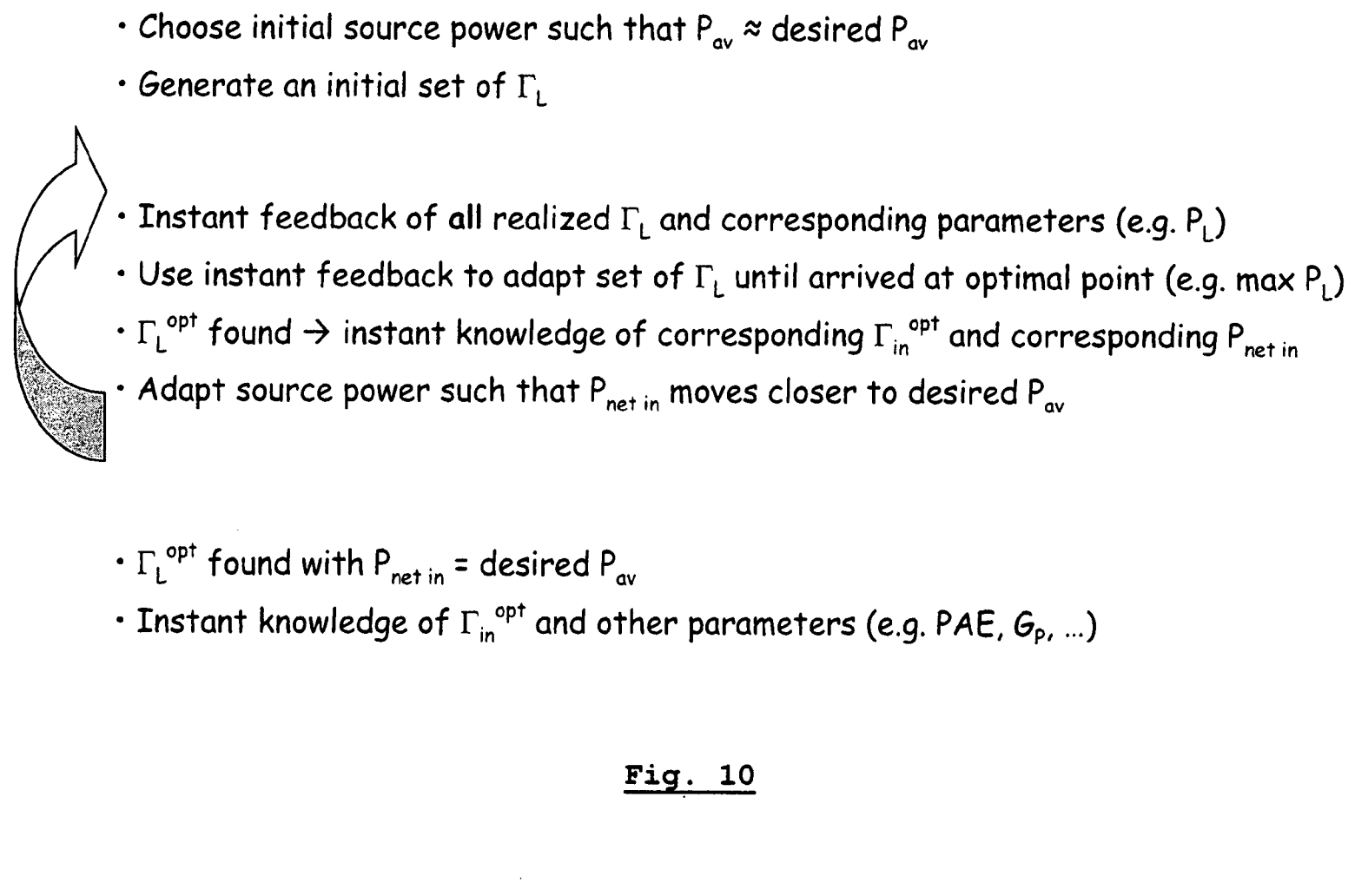

- Choose initial source power such that $P_{av} \approx$ desired $P_{av}$
- Generate an initial set of $\Gamma_L$

- Instant feedback of all realized $\Gamma_L$ and corresponding parameters (e.g. $P_L$)
- Use instant feedback to adapt set of $\Gamma_L$ until arrived at optimal point (e.g. max $P_L$)
- $\Gamma_L^{opt}$ found → instant knowledge of corresponding $\Gamma_{in}^{opt}$ and corresponding $P_{net\ in}$
- Adapt source power such that $P_{net\ in}$ moves closer to desired $P_{av}$

- $\Gamma_L^{opt}$ found with $P_{net\ in}$ = desired $P_{av}$
- Instant knowledge of $\Gamma_{in}^{opt}$ and other parameters (e.g. PAE, $G_P$, ...)

Fig. 10

N-port device
10
11
Port 1
Port i
Port N
15
16
$f_1$
$f_M$

Model $$\begin{cases} B_1(f_0) = f_1(A_1(f_0), A_2(f_0)) \\ B_2(f_0) = f_2(A_1(f_0), A_2(f_0)) \end{cases}$$

Characteristic Impedance: 50 Ohm $$B_1(f_0) = g_1(|A_1(f_0)|, |A_{c2}(f_0)|, \theta)\, e^{j\,\mathrm{Phase}(A1(f0))}$$

$$B_{c2}(f_0) = g_2(|A_1(f_0)|, |A_{c2}(f_0)|, \theta)\, e^{j\,\mathrm{Phase}(A1(f0))}$$

$$\theta = \mathrm{Phase}(A_{c2}(f_0)/ A_1(f_0))$$

↓

$$|A_1(f_0)|_i,\ |A_{c2}(f_0)|_j,\ \theta_k,\ B_{1,ijk},\ B_{c2,ijk}$$

i: stepping input power
j: stepping output power (limited by the impedance region)
k: discretisation of the continuous phase

Fig. 17

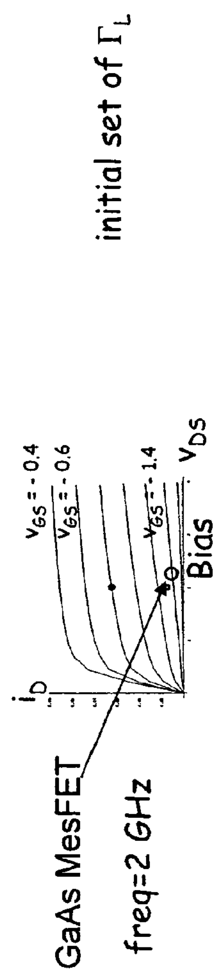
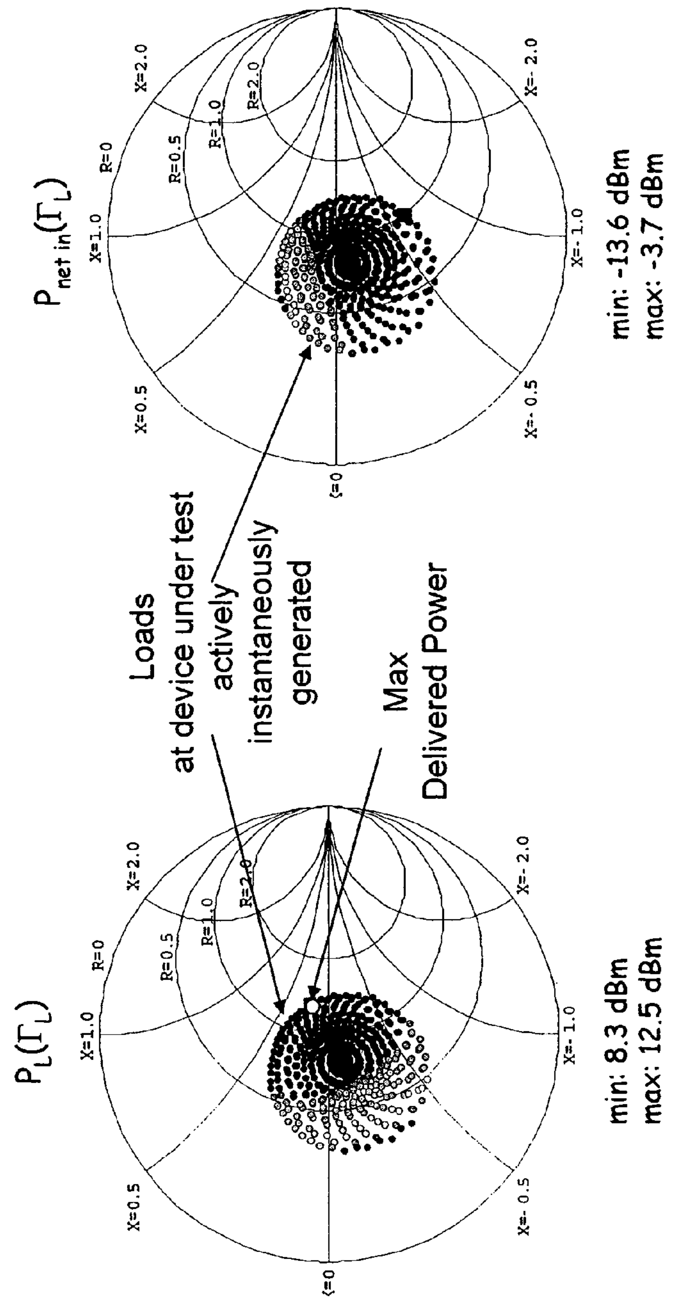
Fig. 19

REAL-TIME DEVICE CHARACTERIZATION AND ANALYSIS

RELATED APPLICATIONS

This is a continuation application under 35 U.S.C. § 120 of WO 2005/121817 A1, filed as PCT/BE2005/000093 on Jun. 7, 2005, which is hereby incorporated by reference. This application claims the benefit of the filing date of U.S. Patent Application No. 60/577,534, filed Jun. 7, 2004, which is hereby incorporated by reference.

BACKGROUND OF THE INVENTION

1. Field of the Invention

The present invention relates to the field of measurements systems for electronic components and devices like power amplifiers and other. It also relates to methods for characterizing and analyzing the behavior of such devices.

2. State of the Art

Presently source-pull and load-pull techniques are used to characterize amplifiers under different impedance conditions and to find the optimal source and load matching circuitry for certain component characteristics. Source-pull provides different impedances at the input of the device while load-pull provides different impedances at the device output. Different device characteristics are measured under different impedance conditions in order to find the impedance condition that optimizes one or more characteristics. To provide different impedances to the amplifier, two main approaches exist: passive (mechanical or electrical) or active techniques (active loop or power injection from external source).

Because the tuning process is cumbersome (e.g., tuners and system parts need to be characterized separately) and the measurement process is slow, no real-time feedback is given. Therefore, the measurement set-ups are automated to collect power amplifier characteristics, while tuning the output and input impedance, while stepping power levels, etc. The calculated characteristics are displayed afterwards, typically using contour plots of these characteristics on a Smith chart.

For mechanical passive tuners, typically a step motor is used to control the tuning of the mechanical part (e.g., position and depth of a probe or resonance circuit dimensions), while for electrical passive tuners an electrical characteristic of a component is adapted to change the presented impedance (e.g., changing transmission line length using PIN diodes). For active tuners using an active loop, the amplifier output wave is sampled using a coupler structure, amplified/attenuated and phase shifted before injecting back towards the component under test. To avoid a feedback loop, the source at the input can be split towards the output via a gain/attenuation and phase control. As an alternative a second synthesizer is used at the output, locked to the synthesizer at the input. By controlling the amplitude and phase of the second source, different impedances are realized. These approaches to active injection are described in patent documents WO03/048791-A2 and U.S. Pat. No. 6,509,743-B as well as in the paper *"A Time Domain Large Signal Measurement Setup"* (H. Arthaber et al., *Int'l Journal of RF and Microwave Computer-Aided Engineering, Vol.* 15, *No.* 1, January 2005, pp. 3-12). In patent document U.S. Pat. No. 6,348,804-B1 the active approach with two separate sources is explained in the context of extracting scattering parameters faster and in more realistic conditions.

To measure the amplifier characteristics a first vector network analyzer is used off-line to characterize all parts of the measurement set-up (by their S-parameters), while during source-pull and load-pull a power meter is used to measure the transferred power (see FIG. 1). Disposing of the S-parameters of the different components in the set-up and measuring the transferred power, one can calculate a lot of important device characteristics but not all. For the above-mentioned active tuner systems, a vector network analyzer is usually required to measure each time the synthesized impedances.

With the prior art systems as shown in FIG. 1, source-pull is performed by changing the states of the source tuner, while maintaining the impedance at the output to a constant value and regulating the microwave synthesizer to maintain a given available power. This is repeated for different levels of available power, requiring the microwave (or RF) synthesizer to step through a range of values. The source tuner and the source match of the synthesizer need to be pre-characterized. During source-pull it is also assumed that the source match of the synthesizer does not change. With the prior art systems as shown in FIG. 1, load-pull is performed by changing the states of the load tuner, while maintaining the impedance at the input at a constant value and regulating also the microwave synthesizer to maintain a given available power. Of course, the combination of source-pull and load-pull is possible.

Set-ups (as explained in WO03/048791) based on oscilloscopes or Microwave Transition Analyzers (obsolete instrument from Agilent Technologies) have been constructed to characterize transistors, power amplifiers in time and frequency domain, while measuring voltages and currents at the input and output. These types of system can provide complete component information. The systems have been combined with passive tuners and active tuners.

SUMMARY

A measurement system and method is provided to characterize and analyze devices like e.g., power amplifiers, that overcome the drawbacks of the state of the art solutions and to enable the study of memory effects. This approach is connected into simulation tools.

A measurement system for determining at least one characteristic of a device under test (DUT) at least one frequency is described. The measurement system comprises a network analyzer being in connection at least with a first source via a first connector and a second source via a second connector. Each source generates a signal. The network analyzer further comprises signal paths arranged for applying the generated signals to the DUT and arranged for receiving signals output by the DUT. The frequency content of the signal generated by the second source comprises at least a frequency component offset from the at least one frequency that is characteristic of the DUT, the at least one frequency being comprised in the frequency content of the signal generated by the first source. The signal is typically an electrical signal like a voltage or a current. The first source and the second source preferably are synthesizers sharing a same reference clock.

In a preferred embodiment the determined characteristics define the state of the DUT, the state being expressed in terms of voltage/current characteristics or incident/reflected wave characteristics.

Preferably the at least one characteristic is a function of time. Such characteristics can be a characteristic belonging to the group comprising DUT input impedance, gain, net input power, and delivered output power.

In an advantageous embodiment the frequency content of the second source comprises a periodic amplitude modulated tone. Alternatively, another appropriate modulation scheme to cover in real-time the DUT states of interest can be envisaged.

Preferably the first source is a microwave source or a RF source, even more preferably it is a vector signal generator.

In another preferred embodiment the second source is a vector signal generator.

Advantageously the measurement system further comprises at least one pre-match tuner. The pre-match tuner may be positioned between the network analyzer and the DUT. Alternatively it may be between the network analyzer and either the first source or the second source.

In a further embodiment the network analyzer is in connection with the second source via a passive tuner. Between the passive tuner and the DUT advantageously isolation means is provided.

Advantageously the network analyzer is arranged for measuring voltage and currents in amplitude and phase at all DUT ports under multi-tone excitation. Preferably the network analyzer is a large-signal network analyzer.

A typical device under test is a power amplifier. Alternatively, it may also be a diode or a transistor or, more in general, a device with non-linear behavior. It can further be any two-port device or an N-port device.

In the latter case (N-port device) preferably at each port a plurality of vector signal generators is provided. Further at each port a passive tuner is optionally provided between the network analyzer and the plurality of vector signal generators.

In another embodiment there is a system for analyzing a DUT comprising the measurement system as previously described, the measurement system being connected to the DUT, and a simulator tool comprising a simulation circuit, the simulator tool being arranged for communicating with the measurement system.

In another embodiment there is a measurement system for determining at least one characteristic of a DUT at at least one frequency, whereby the measurement system comprises a network analyzer to which a first source is directly connected, the first source configured to generate a first spectral component at at least one frequency. The network analyzer further comprises signal paths configured to apply the generated first signal to the DUT and to receive signals output from the DUT. In a preferred embodiment the network analyzer further comprises means for terminating the DUT at a predetermined load impedance. Advantageously the means for terminating the DUT comprise a pre-matching tuner.

In another preferred embodiment the first source is a vector signal generator configured to generate a second spectral component that forms with the first spectral component a two-tone signal having its carrier frequency at the given frequency.

In another embodiment there is a method for determining at least one characteristic of a DUT at a given frequency, comprising providing a measurement system as described, defining on a Smith chart an area where the characteristic(s) of the DUT is to be determined, generating with the first source a signal at the given frequency and generating with the second source a periodic amplitude modulated signal with a carrier frequency offset from the given frequency, measuring with the measurement system voltages and currents at one or more device ports, while the generated signals are applied, determining the at least one characteristic at the given frequency as a function of time, using the measured voltages and currents.

In a preferred embodiment the method further comprises calculating the impedance at the output of the DUT as a function of time and subsequently mapping the determined characteristic onto the calculated impedance.

Advantageously the area comprises a center point that can be moved around by tuning a passive tuner. Preferably the first source is stepped in power over a predefined range at the given frequency. Optionally some feedback mechanism is used at the DUT input in order to keep the power at the input at a constant level. Advantageously the speed of the periodic amplitude modulation tone of the second source is selected such that the characteristics of the DUT, determined by the two-tone of the first source, have changed a negligible quantity.

In another embodiment there is a method for determining at least one characteristic of a DUT at a given frequency, comprising providing a measurement system comprising a network analyzer to which a first source is directly connected, the first source configured to generate a first spectral component at at least one frequency, the network analyzer further comprising signal paths configured to apply the generated first signal to the DUT and to receive signals output from the DUT, stepping the first source in power over a predefined range at the given frequency or sweeping over a predefined range using a two-tone signal with a carrier frequency equal to the given frequency, measuring with the measurement system voltages and currents at one or more device ports for each power setting, and determining the at least one characteristic at the given frequency for each power setting from the measured voltages and currents.

In an advantageous embodiment the method comprises the further step of calculating the impedance at the input of the DUT at the given frequency for a given (not measured) available input power and the step of mapping the determined characteristic onto the calculated impedance. Alternatively, for a given (not measured) impedance at the input of the DUT calculating the corresponding available powers can be determined. This results in a calculated equivalent of a classic source-pull.

In another embodiment there is a method for characterizing an N-port device at a given set of frequencies, comprising connecting an N-port network analyzer to the N-port DUT, connecting a vector signal generator to each network analyzer port for each frequency of the set of frequencies, choosing one of the vector signal generators as a reference source, applying a two-tone signal with the reference source, the two-tone signal having a carrier frequency equal to the given frequency, selecting another vector signal generator and generating a periodic amplitude modulated tone offset in frequency from the frequency corresponding to the another vector signal generator, repeating the previous act for each vector signal generator, measuring with a measurement system as described voltages and currents at one or more DUT ports, and determining the at least one characteristic at the given frequency set as a function of time, using the measured voltages and currents.

In a preferred embodiment a vector signal generator is connected to one of the network analyzer ports via a passive tuner. Optionally this can be done for each vector signal generator present in the set-up. The method further comprises calculating impedances at selected ports as a function of time presented, using the measured voltages and currents, and mapping the determined characteristic onto the calculated impedance.

In another embodiment there is a method for replacing at a given frequency in a simulator tool a representation of a device under test, whereby the representation is comprised in a simulation circuit, comprising providing a measurement system as previously described, providing means for communication between the measurement system and the simulator tool, initializing the measurement system and measuring currents at one or more DUT ports, and replacing the representation of the DUT by a current source at each port of the DUT, the current source being assigned a spectral component of the measured current at the corresponding port.

In a specific embodiment the current sources are given a common arbitrary delay. The method then typically comprises further tuning the arbitrary delay when simulating the simulation circuit to minimize the phase error between the measured voltages and the voltages obtained while simulating.

In another embodiment there is a method for deriving a table-based model of a DUT expressing a reflected wave as a function of an incident wave at a given frequency, comprising determining the maximum power at a DUT input at the given frequency, generated by the first source, determining the maximum power, generated by the second source at a frequency component offset from the given frequency, thus defining a closed area on a Smith chart, determining a center point of the area on the Smith chart to transform a measured incident/reflected wave at the DUT output, decreasing with predefined steps the power from the first source and determining the corresponding power from the second source to cover at least the area, stepping in predefined steps the power from the second source for each power level of the first source, from the maximum power of the second source to a predefined minimum, measuring at the DUT input and output as a function of time incident and reflected waves for each power setting, creating an equidistant grid for the phase between incident wave at the DUT input and output at the given frequency, and using interpolation on the reflected waves at the DUT input and output to create a table-based model on an equidistant grid of phase and power of incident wave at the input and output.

In yet another embodiment there is a method for designing a power amplifier, comprising applying the method previously described in order to optimize a given characteristic of the power amplifier by determining the optimal input impedance of the power amplifier and the optimal output impedance to be presented by a next stage, calculating a net power input to the power amplifier and displaying the net power on a Smith chart together with the at least one characteristic, tuning the power of the first source until the net power input to the power amplifier is equal to a given available power, designing a first circuit matching the output impedance provided by the preceding stage to the optimal input impedance at the given frequency, and designing for the amplifier output a second matching circuit, having an input impedance equal to the optimal output impedance.

BRIEF DESCRIPTION OF THE DRAWINGS

FIGS. 7A, 7B and 7C represent the active injection at an output frequency which is offset from the input frequency.

FIG. 10 shows a schematic representation of a design approach which can be performed in real-time.

FIG. 17 represents the behavioral model as continuous function of phase Θ and its discrete form.

FIG. 19 represents the delivered power and net power in on top of the generated loads for a biased GaAs MESFET.

DETAILED DESCRIPTION OF CERTAIN EMBODIMENTS

The following detailed description of certain embodiments presents various descriptions of specific embodiments of the invention. However, the invention can be embodied in a multitude of different ways as defined and covered by the claims. In this description, reference is made to the drawings wherein like parts are designated with like numerals throughout.

The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

In contrast to prior art set-ups, based on oscilloscopes or Microwave Transition Analyzers, certain embodiments allow a complete high-frequency (HF) characterization of electronic components and power amplifiers (PA) in a matter of seconds. 'Complete' means that based on the measured signals the state of the component is uniquely defined. The state comprises the voltages and currents or incident and reflected waves at all ports of the component. The speed is achieved through the combination of a large-signal network analyzer with 'smart' active source- and load-pull that brings the component in a matter of seconds in similar states as with the much slower classic source- and load-pull. The combined measurement system is suited for characterizing in real-time devices like power amplifiers and components that preferably but not necessarily display a non-linear behavior, etc. . . . From now on the term 'device' is understood to mean either a component (e.g., a diode of any kind, a transistor) or an actual device (e.g., a power amplifier, a circuit or assembly containing at least one of the mentioned components, or in general any device that possibly can demonstrate non-linear behavior). Because of the complete characterization, all quantities, obtainable with classic source-pull and load-pull systems, can be derived instantaneously. Additionally, the input characteristics of the device under test, like the input impedance (when valid) and generated harmonics and intermodulation products, are provided in real-time as a function of the 'smart' active source- and load-pull. This enables direct optimal power amplifier design.

Figure 1:
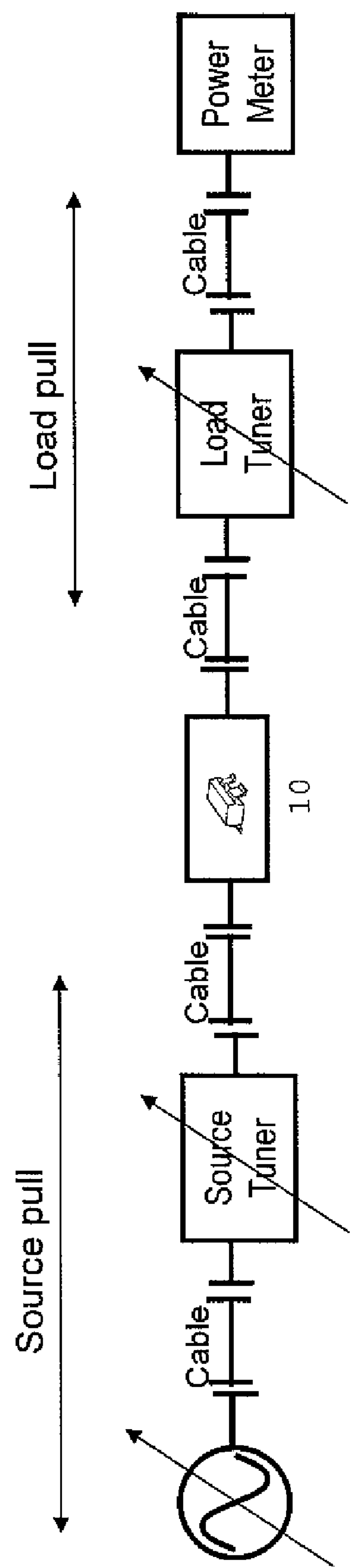
FIG. 1 represents a prior art source-pull and load-pull set-up.
Figure 2:
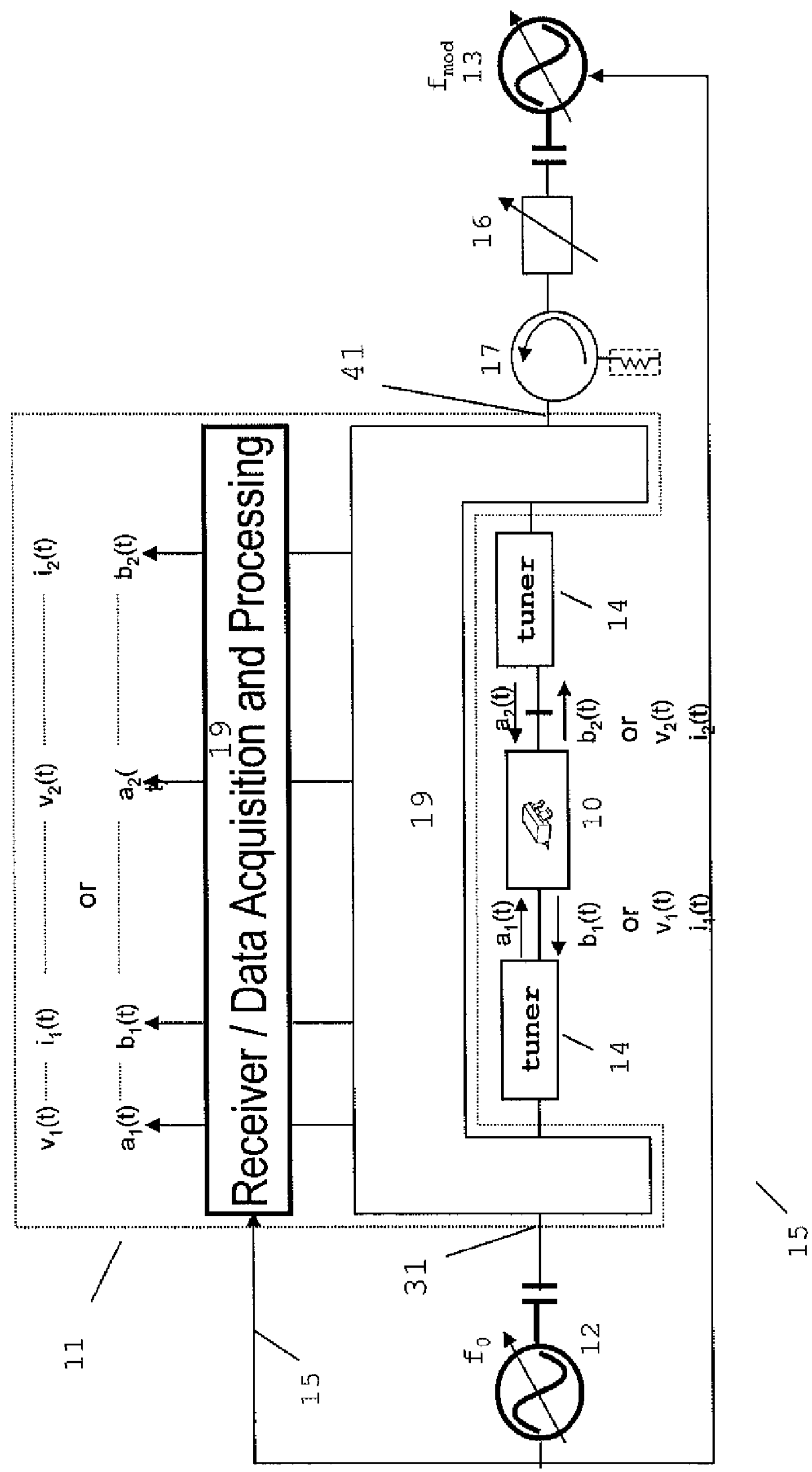
FIG. 2 represents one embodiment of a measurement set-up for two-port devices.
Figure 3:
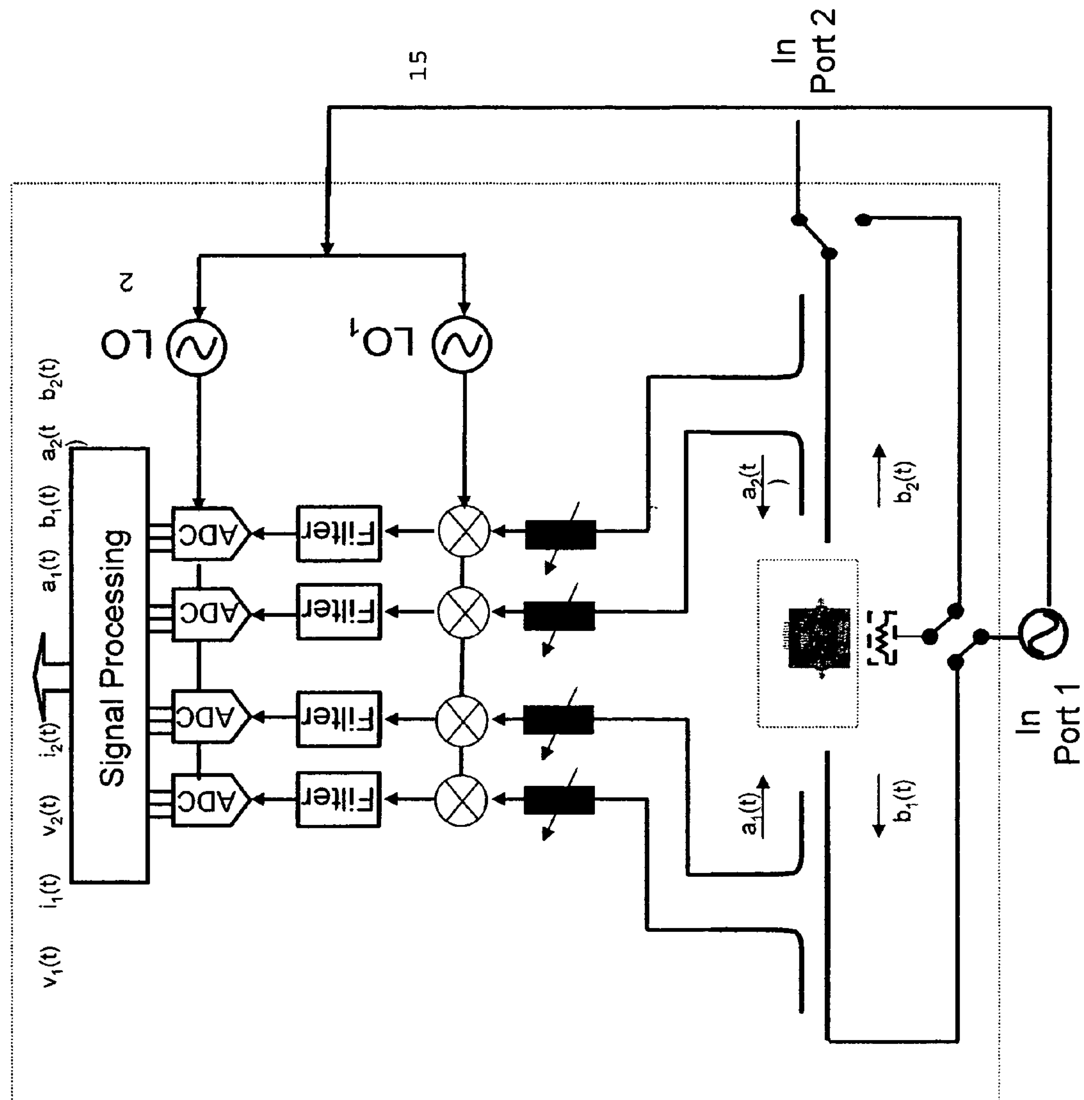
FIG. 3 represents more in detail a block diagram of the large-signal network analyzer of FIG. 2.

In FIG. 2 the complete measurement set-up is depicted, comprising a large-signal network analyzer (11) in combination with additional hardware to create the smart source-pull and load-pull based on smart active injection. FIG. 3 represents a more detailed block scheme of a possible implementation of large-signal network analyzer (11). After a proper calibration the network analyzer can measure accurately at all ports the voltages/currents or incident/reflected waves, which for the 'smart' active source- and load-pull are periodic modulation signals comprising a signal at a fundamental frequency $f_0$ and its harmonics, as expressed by $$x(t) = \mathrm{Re}\left(\sum_{i=0}^{N} \underline{X_i}(t)e^{ji\omega_0 t}\right) \quad \text{(eq. 1)}$$

where $\omega_0$ equals $2\pi f_0$ and $X_i(t)$ denotes the time-dependent $i^{th}$ harmonic. Re(.) represents the real part. The calibration results in error coefficients that eliminate systematic errors introduced by the network analyzer returning the measurements at the device under test.

The device under test (10) is connected to the large-signal network analyzer (11), optionally with one or two pre-match tuners (14) (see FIG. 2). Depending on the insertion losses of the network analyzer, these tuners (14) can possibly be placed outside the large-signal network analyzer (11). The pre-match tuners (14) are used to measure highly reflective devices. In most cases the instrumentation hardware, including the sources, are 50 Ohm systems. This gives rise to a large mismatch with highly reflective devices (the impedance of which is far from 50 Ohm). To limit the source power requirements a pre-match tuner matches the 50 Ohm to the highly reflective device. When these tuners are between the device and the signal separation hardware (19) of the network analyzer (see FIG. 2), the tuners are pre-characterized with S-parameters as a function of the position of the tuning elements. The error coefficients of the network analyzer, which correct for all systematic errors introduced by the network analyzer hardware, are adapted based on the S-parameters corresponding to the tuner position. In this way voltages and currents at the device under test can be measured correctly. A signal generating source (12), e.g., a microwave source or a RF source, is connected via network analyzer connector (31) to the input of the device under test and generates a test signal with tunable power and frequency. The microwave source can be replaced by a vector signal generator for 'smart' active injection at the input (source-pull). A vector signal generator (13) connected to the output of the DUT via network analyzer connector (41) is used to create a smart signal to synthesize different impedance states in a fast way. The source at the input (31) and the vector signal generator at the output via connector (41) should be synchronized. One way to synchronies is to share the reference clock of the first source (12), which outputs a reference clock (15). This reference clock (15) also synchronizes the network analyzer (11). Both sources (12) and (13) are synthesizers, creating their output signal from the reference signal. Additionally a tuner (16) can be mounted at the output of the network analyzer and in connection with the second source (13), allowing a change of the load impedance position on a Smith chart. In this way an impedance area to be explored by the smart active injection can be pre-defined. Depending on the power levels, isolation means (17) is used to separate the power coming from the device under test (10) and the active injection.

Source-Pull

Figure 4:
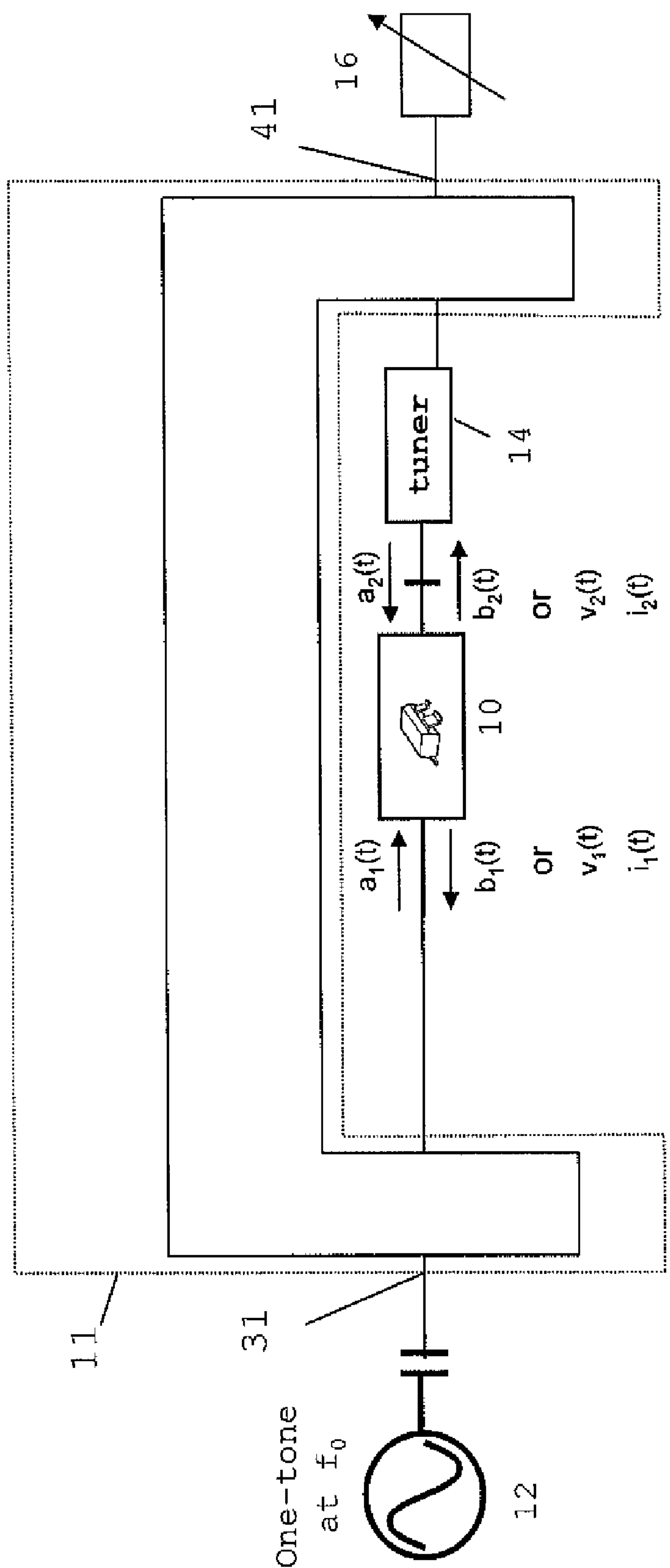
FIG. 4 represents a simplified scheme of the set-up shown in FIG. 2.

With the set-up of the system, in FIG. 4 presented in a simplified form dedicated to source-pull, the impedance at the output of the DUT is also maintained at a fixed value by fixing the pre-match load tuner (14) and/or the passive tuner (16). However, to perform a source-pull the source tuner is no longer used and neither is the assumption of constant source match of the signal generating source (12). To perform a source-pull, the synthesizer power is stepped across a range of interest at a given frequency. The range of the power sweep will be larger than with classic prior art systems, because there is no source tuner present to improve power transfer. With the large-signal network analyzer the voltages and currents or incident and reflected waves, including fundamental frequency and harmonics, are always measured both at input and output for each power setting $P_i$. For each $P_i$ one measures $v_1(t)$, $i_1(t)$, $v_2(t)$ and $i_2(t)$ or the incident/reflected waves at both ports. The signals can be represented also in frequency domain according to eq. 1. In that case, $\underline{X_k}(t)$ is time-independent, with k denoting the spectral components of x(t). For each power setting, the following characteristics can then be derived from the voltage/current measurements: input impedance at fundamental frequency, harmonics generated at input, output impedance at fundamental frequency and harmonics, net power in at fundamental frequency and harmonics, delivered power, operational gain, transducer gain etc. When DC characteristics are measured, one can also derive quantities like power added efficiency, which is defined as the ratio of the difference between output power and input power to the DC power.

From the measurements with stepped power $P_i$ it is possible to calculate the valid source matches (in other words, matches presented to the device at the input) with reflection factor $\Gamma_s$ for a given available input power $P_{av}$ that results in the measured incident and reflected waves, using the following eq. 2, $$2(1-|\Gamma_s|^2)Re(Z_0)P_{av}=|a_1-\Gamma_s b_1|^2 \quad \text{(eq. 2)}$$

where $Z_0$ denotes the characteristic impedance used for $\Gamma_s$, $a_1$ and $b_1$ and $P_{av}$ the available power. With available power is meant the power a source (or a previous stage) can deliver when terminated to the conjugate of its own internal impedance, in other words, the maximum power that may be delivered to the external world. This can be calculated for any selected available input power as long it is covered by the power range of the synthesizer used during the measurement. It is also possible, for a given available power and given source mismatch, to select the combination of incident and reflected wave which corresponds closest to eq. 2. In this way, it is possible to calculate with one power sweep different source-pull situations without re-measuring.

Figure 5:
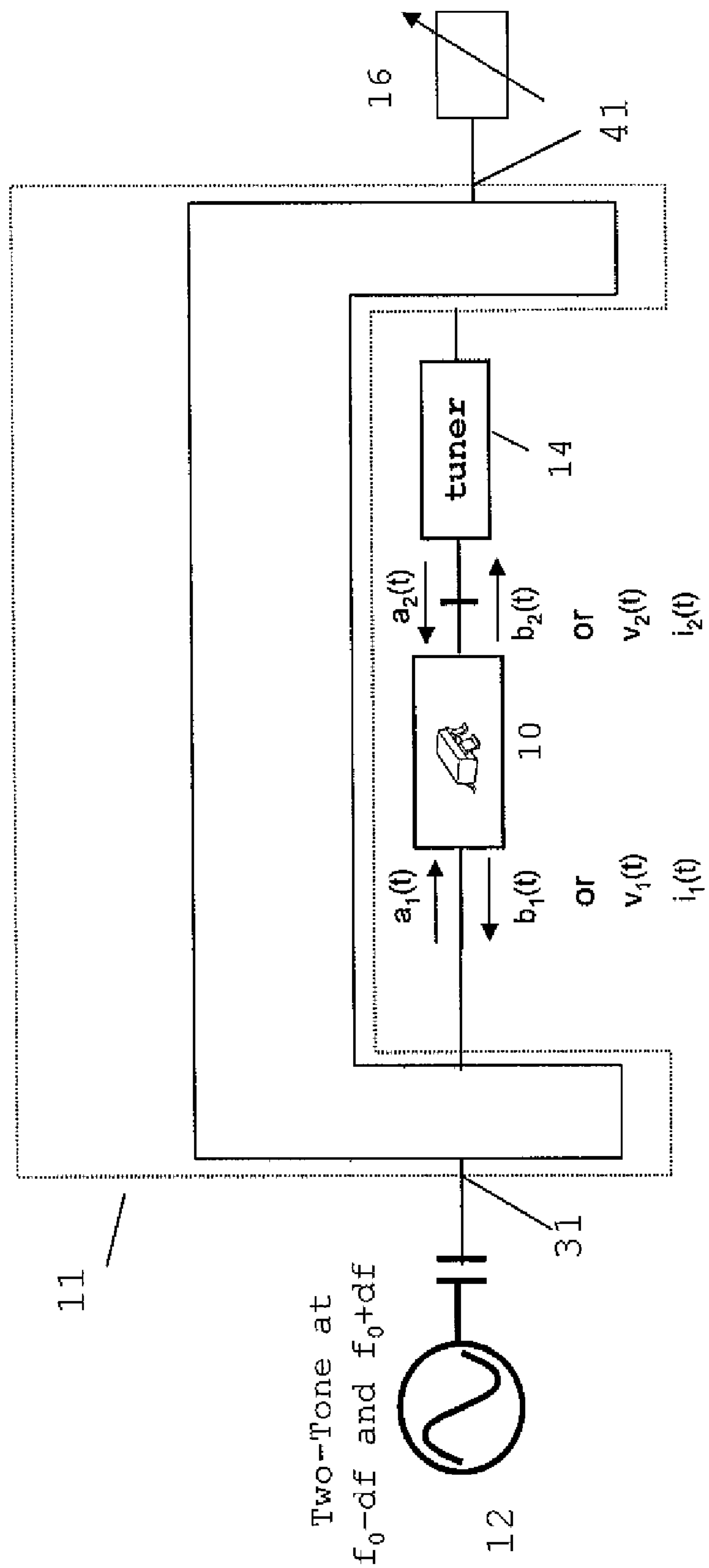
FIG. 5 represents the same scheme as FIG. 4, but with a two-tone signal generated by source (12).

Replacing the microwave synthesizer (12) at the input with a vector signal generator as signal generating source or with the combination of two microwave synthesizers, locked by the same reference clock (15), which is similar to the functionality of the vector signal generator in this context, a two-tone can be generated to accelerate the characterization process even more. The two-tone automatically performs a power sweep at the input with a rate equal to the frequency difference between the two tones and therefore allows a real-time characterization (see FIG. 5). The two frequency components $f_0$−df and $f_0$+df give rise to an amplitude modulated signal $\cos(2\pi\, df\, t)\cos(2\pi f_0 t)$, resulting in a power sweep at the input (in other words, in a power continuously changing as a function of time instead of stepped power). Using eq. 1 one derives from the measurements the voltages $\underline{V}_{j,i}(t)$ and currents $\underline{I}_{j,i}(t)$, whereby j denotes the port and i the respective spectral component (the fundamental frequency or an harmonic). With each time stamp $t_1$ there is a corresponding input power and a corresponding set of voltages and currents, $\underline{V}_{j,i}(t_1)$ and $\underline{I}_{j,i}(t_1)$.

As a result $a_1$ and $b_1$ (and also the output characteristics) are measured at the fundamental frequency and harmonics as a function of time, similarly to the voltages and currents. Instead of a discrete set of measurements of $a_1$ and $b_1$, one now has a continuous set as a function of time. In this way the same information is collected as with a stepped one-tone signal, except that it is now obtained in a faster and automatic way as a function of time. To avoid or to separate memory effects the tone spacing can be selected small enough. By changing the distance between the two-tones this set-up also allows studying memory effects that can be induced in the device.

Load-Pull

A smart active injection can be introduced at the network analyzer connector (41) towards the device output, whether or not in combination with a passive tuner (16), to provide in a fast way a large set of load matches or impedances to the device under test. Again the large-signal network analyzer (11) is used to measure voltages and currents at input and output of the device the characteristics of which are determined for each realized load match (FIG. 2). For highly reflective devices a pre-match tuner (14) is possibly used, directly connected to the device output. Based on the S-parameters depending on the position of this tuner (14) the error coefficients of the network analyzer (11) are corrected and pre-characterized.

Figure 6:
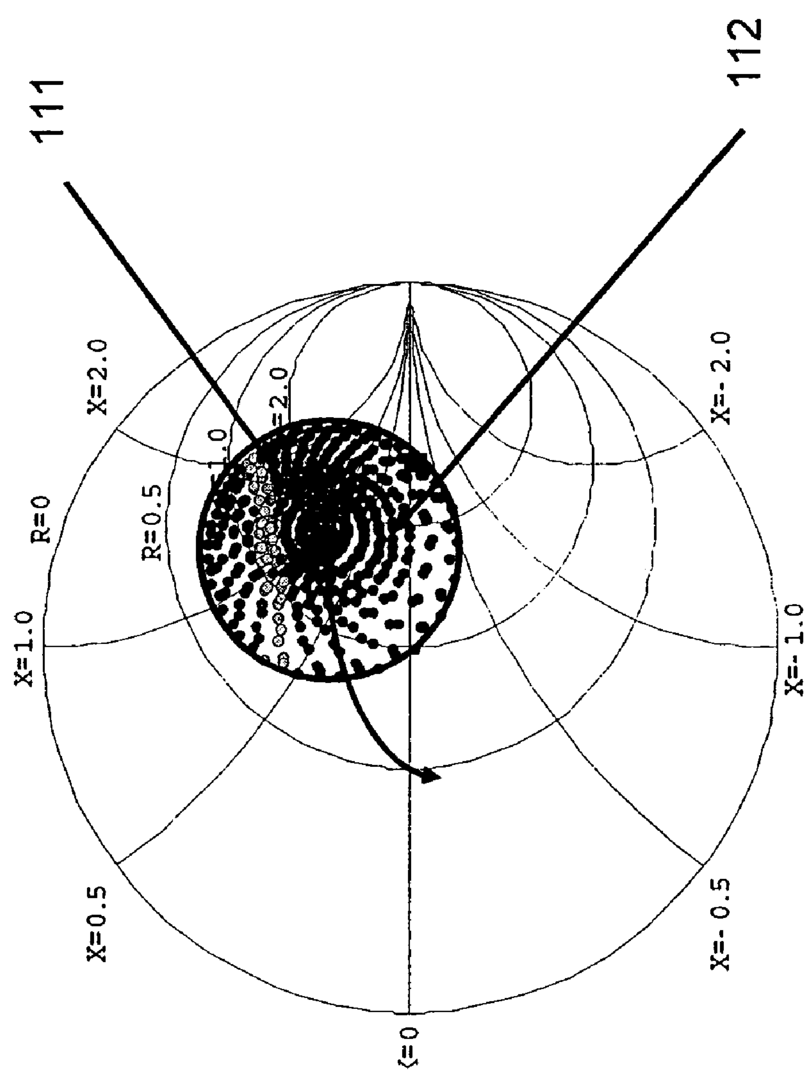
FIG. 6 represents the synthesis of different impedances on a Smith chart of using a passive tuner and smart active injection.

The output tuner (16) is used to change the position of a center point (111) on the Smith chart (FIG. 6). In the area (112) around the center point the device characteristics will be explored using the smart active injection. Changing the output tuner position modifies the position of the center point on the fly. Immediately the device characteristics are measured in the area around the new center point. Using color schemes the characteristic of interest is mapped on the provided load impedances, drawn on the Smith chart (FIG. 6, wherein the color schemes are represented by greyscale). By changing the tuner (16) the complete area is moved, remapping the characteristics each time. This is an easy way to tune to the optimal point using visual feedback.

The smart active injection is realized using a vector signal generator. Such a vector signal generator can be either a commercially available vector signal generator or an I/Q modulator in combination with a memory and two digital to analogue converters for I and Q. Alternatively it can also be a proper combination of two or more synthesizers. The output source (13) should be synchronized with the signal generating source (12) at the input by sharing the reference clock (15).

One possible realization of a smart active injection is by generating an amplitude modulated tone at the output of the DUT with carrier frequency $f_0$+df (df is not related to df of the source pull), which is offset from the frequency $f_0$ at the input side (see FIG. 2). This will present a continuously changing and repetitive load impedance at the output, as indicated in FIG. 6, while the voltages and currents are being measured at input and output of the DUT. From these voltages and currents the desired characteristics can be derived instantaneously as a function of time and as a function of corresponding load impedance. Therefore these characteristics can be visualized on a Smith Chart (FIG. 6).

Figure 7C:
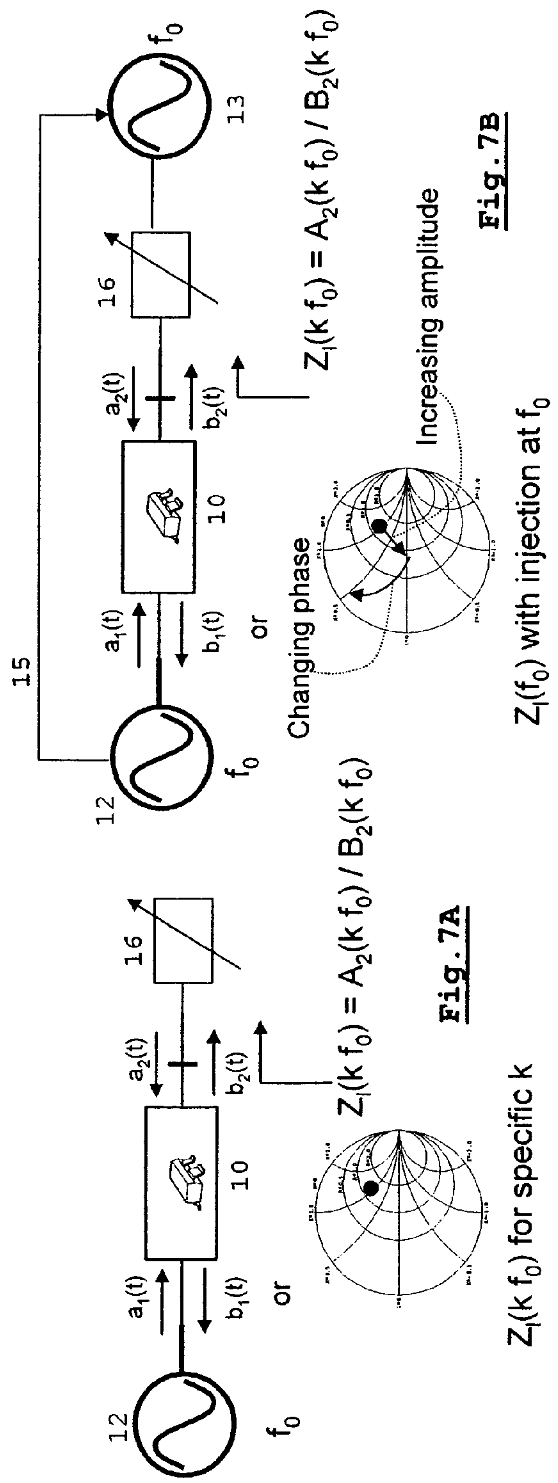

To understand the active injection at the output of the DUT, consider first the synthesizer at the output to be switched off (FIG. 7A). The output tuner (16) reflects the incident wave $b_2(t)$. A fixed impedance $Z_1(kf_0)$ is presented to the device under test (10) at the fundamental frequency (k=1) and harmonics (k>1). Suppose at the output a small signal is synthesized having the same frequency as the input signal. The impedances at the harmonics are not influenced and $Z_1(kf_0)$ (k>1) remains unchanged. However this small signal will increase or decrease (depending on its phase) the already reflected wave $a_2(t)$ at $f_0$, the frequency of excitation. In this way a new load is synthesized. Increasing the amplitude the synthesized load will move away from the impedance with the source switched off. Changing the signal phase will rotate the impedance (FIG. 7B). To change the phase in an automatic way it is sufficient to offset the frequency at the output from the frequency $f_0$ at the input. This creates a closed loop of realized load matches on the Smith chart (FIG. 7C).

Figure 8:
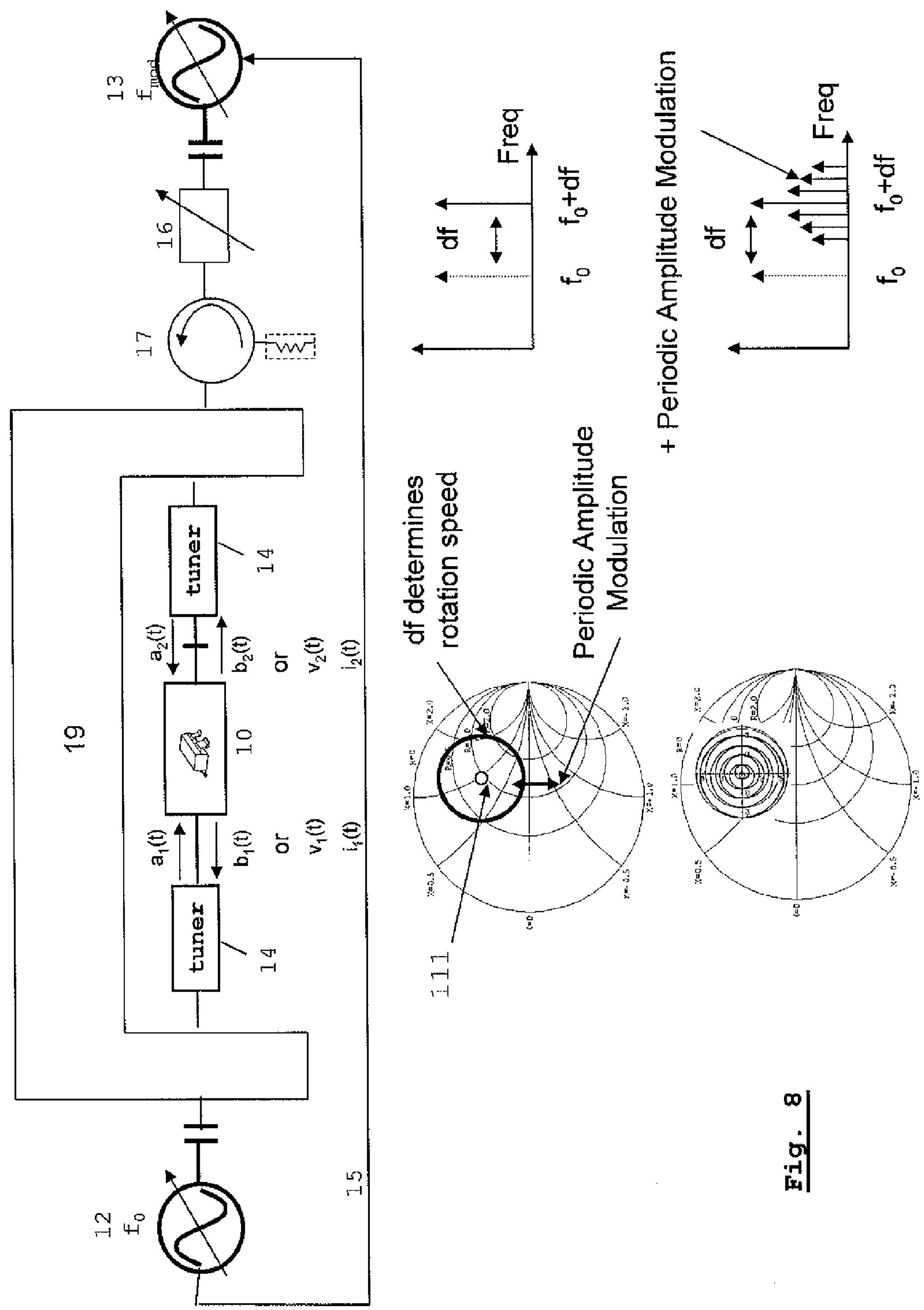
FIG. 8 represents the smart active injection.

On top of this it is possible to modulate the tone at the output in amplitude to vary the amplitude such that a spiral is generated for the impedance presented to the output of the device under test. The signal is synthesized as a periodic signal, such that the spiral closes properly (FIG. 8) after a given time.

Of course, the incident and reflected waves or the voltages/currents at the input and output of the device follow the excitations at both input and output and demonstrate the same periodicity. For each synthesized output impedance, it is possible to look up the corresponding voltage and current at the device and to derive instantaneously characteristics like delivered power, gain etc. These quantities are plot on top of the sampled impedance trajectory created by the smart active injection. It is easy to provide visual feedback, e.g., using a different color for the level of these quantities (FIG. 6). These plots are created within the same time as the time to synthesize the active injection signal. Depending on the selected frequencies the measurements can be slowed down to seconds or speeded up to sub-seconds. Therefore this set-up offers the additional advantage of also allowing the study of memory effects in the device.

One of the derived quantities is the input impedance for any given synthesized load impedance. The prior art solutions are not able to provide this information directly. Based on this information, the power amplifier design process can be improved and accelerated.

Figure 9:
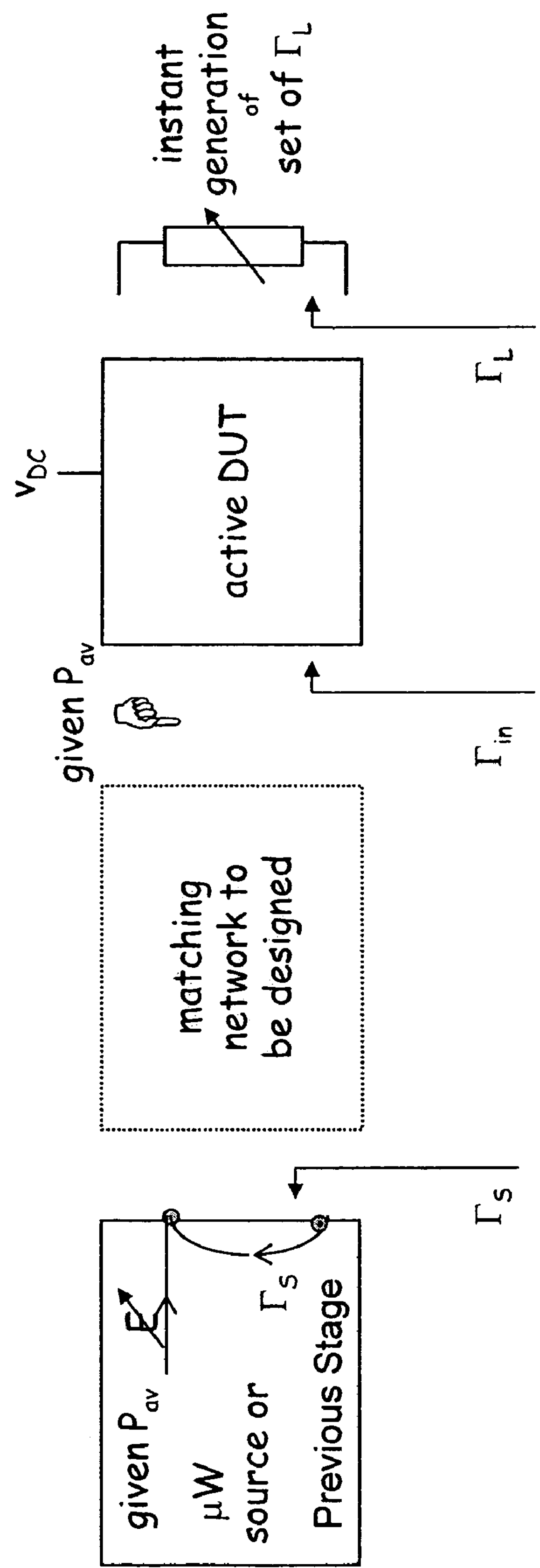
FIG. 9 illustrates exemplary design requirements of an optimal matching network.

Part of the design of an amplifier consists in matching the amplifier to its previous stage to transfer optimally the power available from that previous stage, while the amplifier is properly terminated to optimize one or more performance factors. In a multi-stage amplifier this is repeated from stage to stage. Typically, one knows or specifies the available power of the previous stage and usually when it is designed, one already has a target output impedance. To use the power of the previous stage optimally a matching circuit should be designed in order to match the output impedance of the previous stage (corresponding reflection factor $\Gamma_s$) to the amplifier input impedance ($\Gamma_{IN}$), which is terminated with ($\Gamma_L$) for an optimal performance (see FIG. 9).

Certain embodiments allow the immediate determination of the corresponding input impedance ($\Gamma_{IN}$) of the power amplifier for a presented output impedance $\Gamma_L$. Because of the real-time aspect of the set-up the power of the signal generator (12) at the input can be tuned to a level such that the measured net input power equals the available power, which one knows will be present in the previous stage, while optimizing one of power amplifier characteristics.

It is possible to display on the same Smith chart the various load states, created by combining the changing positions of tuner (16) and the smart active injection, in combination with the considered performance factor, e.g., the power delivered to the load. The value of the characteristic can be displayed using a color scale. Meanwhile one can indicate on the Smith chart the load states corresponding as closely as possible to a given net input power that equals the available input power. When one of these points coincides with optimal performance factor, one has found an optimal operating point and all the information to design the input and output matching circuitry is available. An advantage of certain embodiments is that this can be achieved in a much shorter time frame than with a classic load-pull approach (see flow chart in FIG. 10) due to the real-time aspect and the availability of the complete information.

Source-Pull and Load-Pull

In this case smart active injection is used both at the input and the output side and a vector signal generator or a source with similar capability is used at the input as well as at the output. Both vector signal generators share a reference clock (15).

One can repeat the load-pull with active smart injection at the output, as explained previously, for different input power levels. With each input power level corresponds a maximum power level at the output to cover a certain region on the Smith chart (FIG. 6). If one increases the input power step by step and uses the smart active injection at the output as previously explained, the output power should be increased step by step to track the input power change. This results in a more or less fixed area of generated impedance coverage at the output for the complete range of input power values (FIG. 6). It is possible to automate the input power stepping using a two-tone. This corresponds to the explained source-pull with smart active injection. The frequency distance between the two-tones will be an order of magnitude smaller than the speed of the smart active injection at the output side. To maintain the fixed area on the Smith chart while sweeping the input power, the maximum amplitude of the created area at the output should be amplitude modulated in order to track the power sweep at the input. In this way a device is analyzed in real-time for a range of input power values and for a range of load impedances in a matter of seconds.

The explanations up to now considered a two-port device excited with one or two frequency sources. The concept of smart active injection for real-time device characterization can be generalized to an N-port device with M frequency tones.

An N-port device in a system is considered excited by a set of frequency tones $f_{si}$. The device is assumed to behave non-linearly but not chaotically. Therefore mixing frequency tones are generated: $\Sigma_i k_i f_{si}$ with $k_i \epsilon$ ¢. The numbers $k_i$ depend on the type of non-linearity and bandwidth limitations of the system. As a result a number of original and mixing tones manifest at the ports of the device under test: $f_l$ with $l=1, \ldots, M$.

Figure 11:
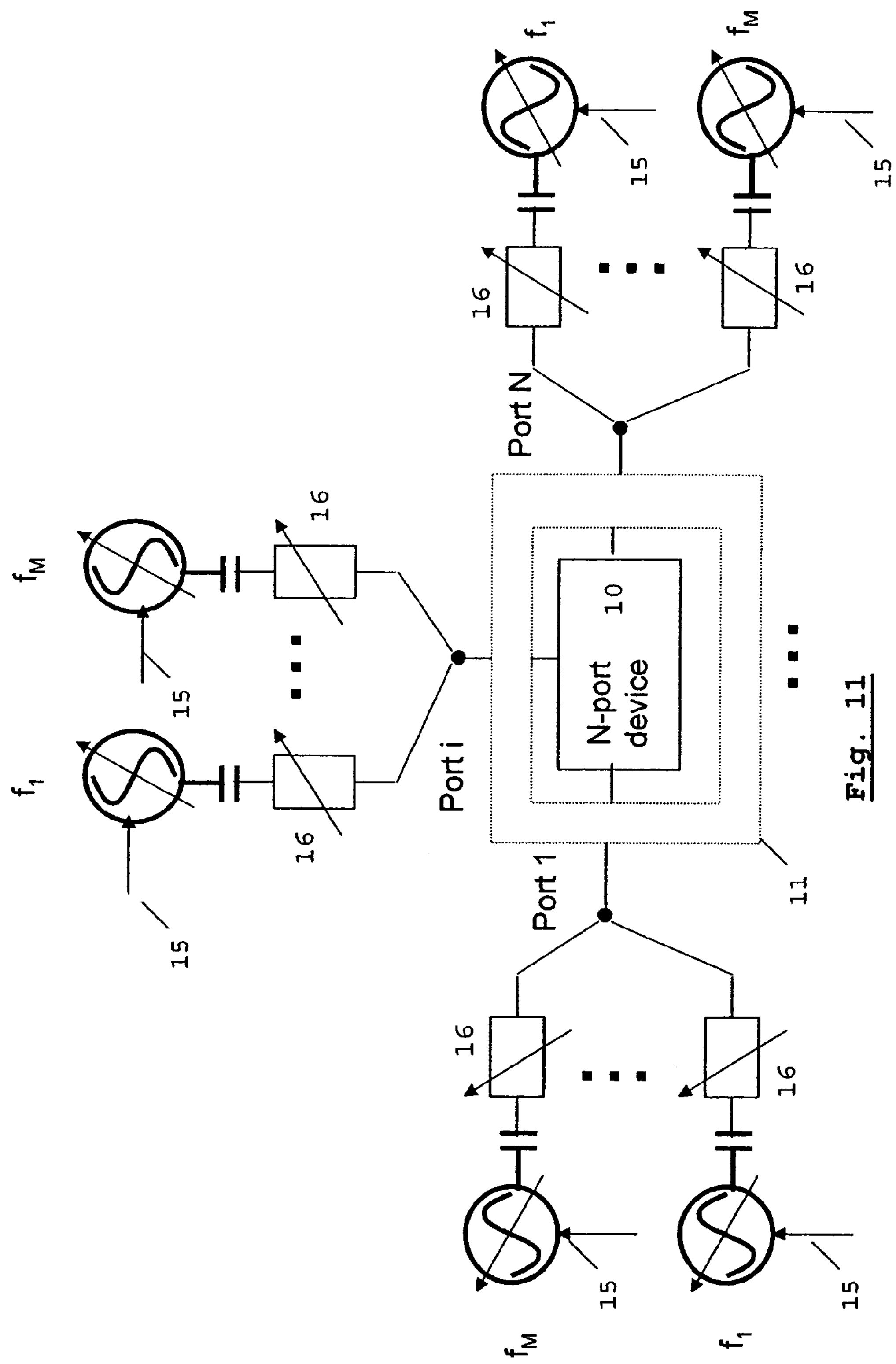
FIG. 11 shows the generalization of source-pull and load-pull for an N-port device with M tones.

To characterize the device excited by this set of tones, a set-up as shown in FIG. 11 is created. For each tone $f_l$, there is a vector signal generator present at each port, which allows for smart active injection. With each source a passive tuner (16) is foreseen in case the difference between the impedance of the source and the input impedance of the device is too large. This reduces the power requirement of the source to cover a large enough excitation range of the N-port device under test. A subset of these sources is considered as actual excitation of the device, resulting into the considered set of tones $f_l$ with $l=1, \ldots, M$ present in the voltage/current or incident/reflected wave at the ports of the device. All the other sources may be required to perform the full characterization at both the frequencies of excitation and the resulting mixing products. One of the sources considered as an excitation is selected as the reference. The active smart injection for this reference reduces to a two-tone signal around its frequency to sweep the power in an automatic way. The spacing between the tones determines the speed at which the amplitude is swept. All sources share the same reference clock (15).

Consider now a second source and consider a small amount of time in which the first source is almost not changing its amplitude. Within that time interval, one would like to change the phase of the second source while changing the amplitude to synthesize different states for that frequency at that port. The same smart active injection is used as explained for the load-pull case. Of course other ways of smart active injection could be used. The modulation should be selected fast enough to cover the area while one can consider the input power almost constant. Typically this uses modulation speeds 50 to 100 times faster.

One can then consider a next source and repeat the reasoning. Compared to the creation of the states with the first and second source, one wants to create states with the third source while the combined state of the first and second source can be considered as constant. Again one uses the smart active injection with modulation speeds higher than used for the second source. This can be repeated for each source. Finally one ends up with a very slow modulation speed at the first source and a very fast modulation speed at the last source. If one wants to avoid induction of memory effects in the device, this dictates the fastest modulation speed. In turn this determines the slowest modulation speed.

Due to practical restrictions in practice only a limited number of spectral components and a limited number of ports can be exercised.

Device Analysis with Simulation Tools

Because of the complexity, caused by the non-linear behavior of active devices, device analysis is advantageously performed by means of simulation tools. Due to the nature of the measured data (see eq. 1), a harmonic balance simulator ($\underline{X}_i(t)$ is constant or not time-dependent) or envelope simulator ($\underline{X}_i(t)$ is time-dependent) is well suited. In the subsequent paragraphs it is first explained how a representation in the simulator can be replaced by the real device. Secondly a measurement-based behavioral model is extracted and used in a simulation tool.

Figure 12:
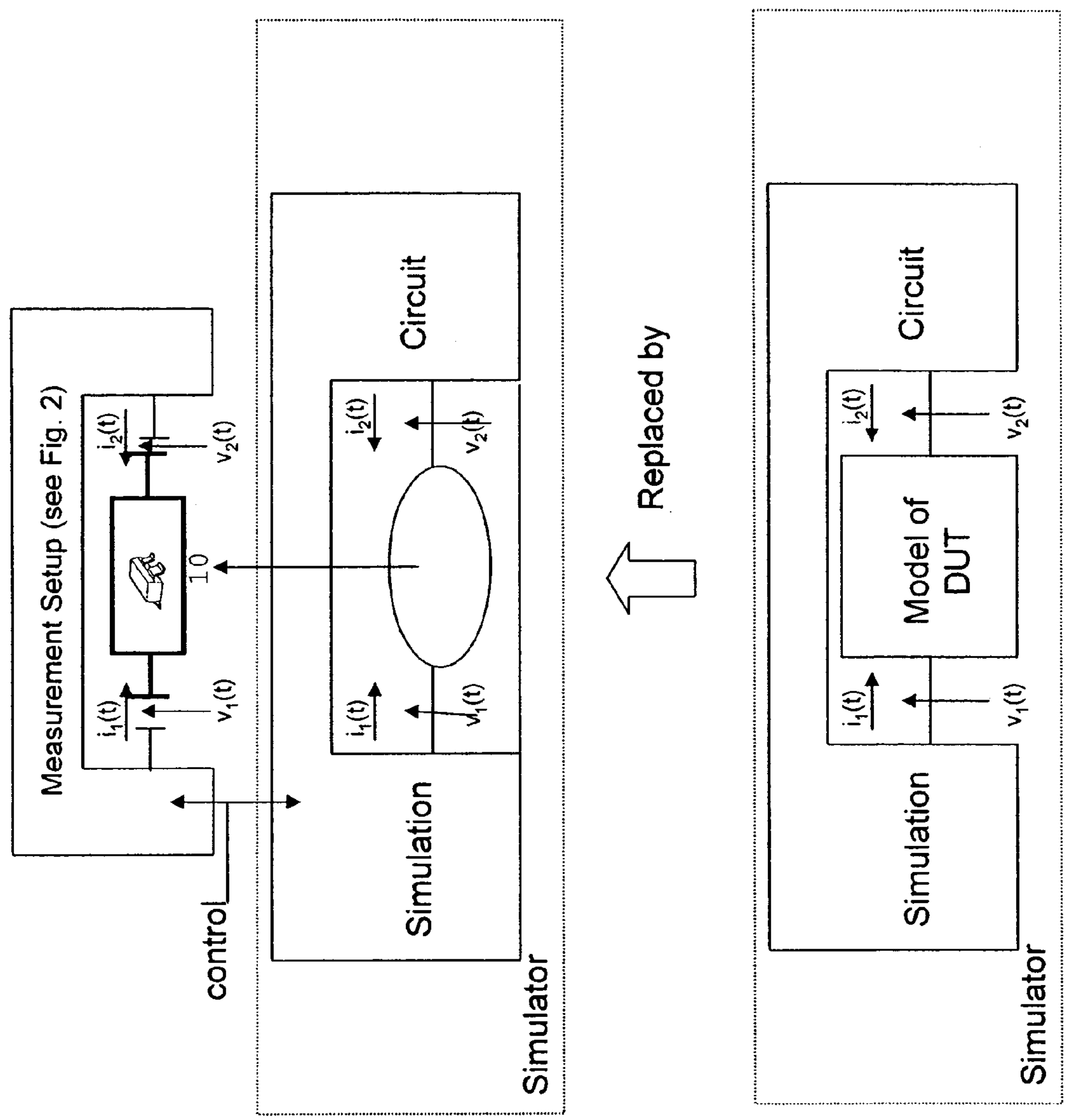
FIG. 12 represents the substitution of a device representation in a simulator with the real device connected to the measurement set-up.

In certain embodiments, to replace a representation of a device by the real device, a requirement is that the simulator be able to control the hardware during a simulation. This is a practical requirement for the simulator. To perform real-time device analysis, the device representation that usually makes part of a larger simulated circuit is replaced (FIG. 12) by the earlier explained hardware set-up shown in FIG. 2. The following explanation is not limited to one frequency only. The limitations will be enforced by the capabilities of the hardware set-up.

Figure 13:
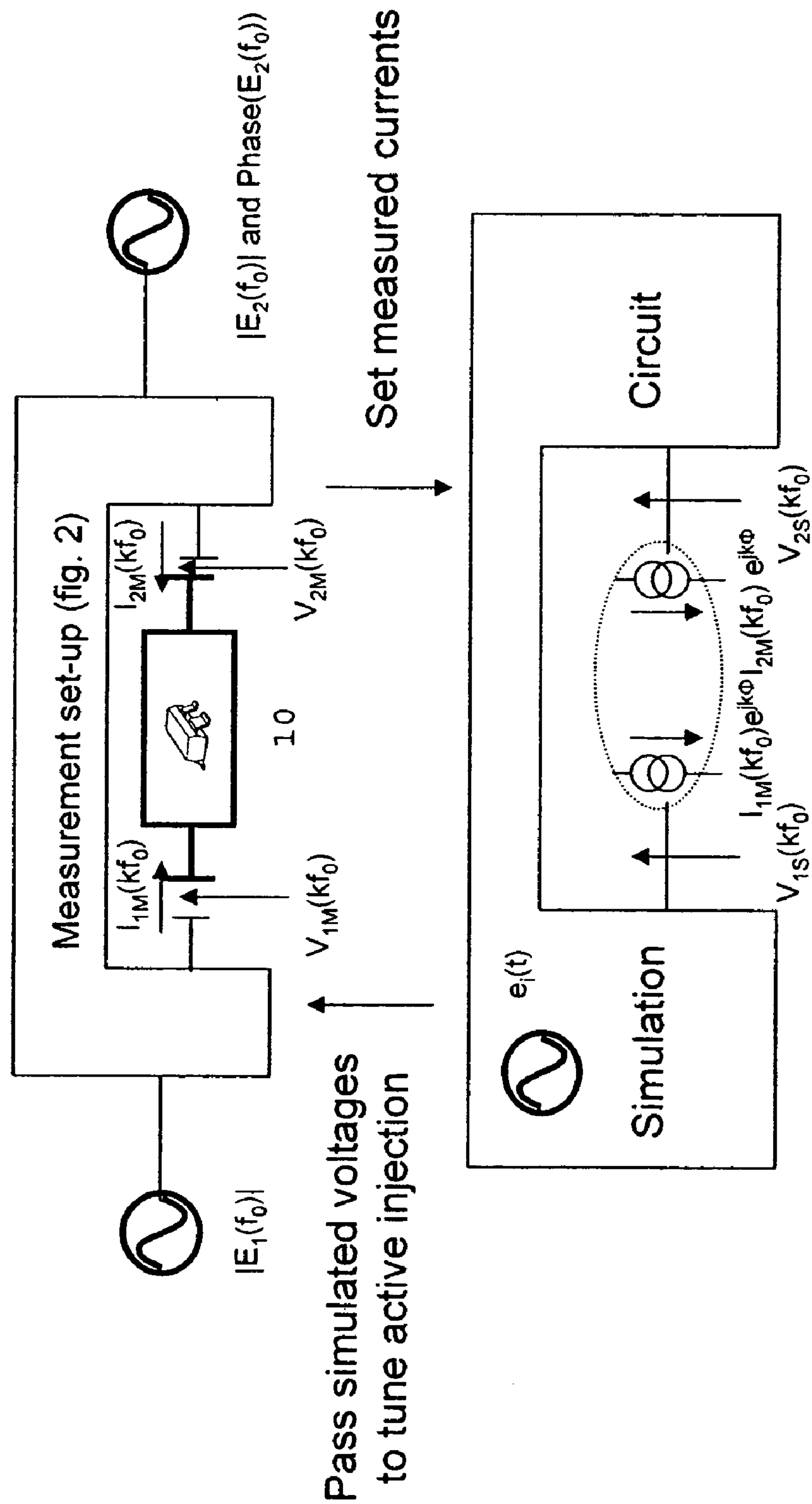
FIG. 13 represents the interaction between the simulator and the set-up at $kf_0$.

The representation is replaced at each of its ports with current sources for each of the measured frequencies. These current sources are set equal to the spectral components of the measured currents at the real device with one common arbitrary delay (FIG. 13). This delay is tuned, while simulating the complete circuit, in order to get the simulated voltages as closely as possible to the measured voltages. Then the considered spectral components (usually enforced by the limitations of the hardware set-up) of the simulated voltages at the ports of the replaced representation are used to control the sources (active source-pull and load-pull) in the hardware set-up, so that the considered spectral components of the voltages at the real device get as close as possible to those of the simulated voltages. Then the measured currents are used again to set the current sources in the simulator and the process is repeated, until both measured and simulated voltages and currents agree. This approach focuses on the RF behavior. If desired the DC can be considered and be controlled from the simulator to maintain a certain bias setting. This approach is very comparable to the iterations carried out during simulation in a harmonic balance.

Due to the limitations of the hardware set-up (FIG. 12) the considered spectral tones from the above explained approach are limited to one frequency $f_0$. By adding active injection at other frequencies, it is possible to extend this concept to these frequencies as explained above.

By adapting the input power via the control between the simulator and the measurement set-up, the output power and the output phase (as compared to the input) in the measurement set-up (source-pull and load-pull), it is possible to bring the device into any desired state (within the capability of the hardware) at the fundamental frequency $f_0$ in a matter of seconds.

The analysis of a device is based on realizing the same voltage/current relationship at the device in the simulator as in the real set-up.

First the sources of the hardware set-up are set to an acceptable operational value. Consider now the measured voltages and currents in the frequency domain at frequency $kf_0$: $V_{1M}(kf_0)$, $I_{1M}(kf_0)$, $V_{2M}(kf_0)$, $I_{2M}(kf_0)$. The current sources, replacing the device under test in the simulator, are set to the measured currents: $I_{1M}(k_0)$ and $I_{2M}(k\,f_0)$. Now the circuit can be simulated, resulting into simulated voltages at the port of the replaced device: $V_{1S}(kf_0)$ and $V_{2S}(kf_0)$. An optimization is performed, changing the arbitrary delay $e^{jk\Phi}$ of the simulated current sources until the phase error function given by the expression below is minimized.

$$\text{Phase error function}=\text{Max}_i[\text{Phase}(V_{iS}(kf_0))-\text{Phase}(I_{iM}(kf_0)e^{jk\Phi})-\text{Phase}(V_{iM}(kf_0))+\text{Phase}(I_{iM}(kf_0))].$$

Then the error between the spectral components of the simulated voltage $V_{iS}$ and the measured voltage $V_{iM}$ at the input is minimized by proportionally adapting the power at the input in the measurement set-up. This is then repeated for the output by adapting the power and the phase of the output source in order to bring the measured output voltage close to the simulated output voltage and to align the phase difference between the simulated output voltage and current with the measured output voltage and current. Again the input is optimized in case there was interaction between input and output. For the optimization scheme different approaches can be followed. For example, a global optimization can be performed using a gradient method. The optimization schemes used in simulators are relevant candidates to select the best approach.

Once this optimization has been done with the measurement set-up, the measured currents are used again to set the current sources in the simulator. The procedure is repeated until the minimum of an error criterion is reached, like e.g., the maximum of the complex errors of the voltages in the simulator and the measurement system.

Figure 14:
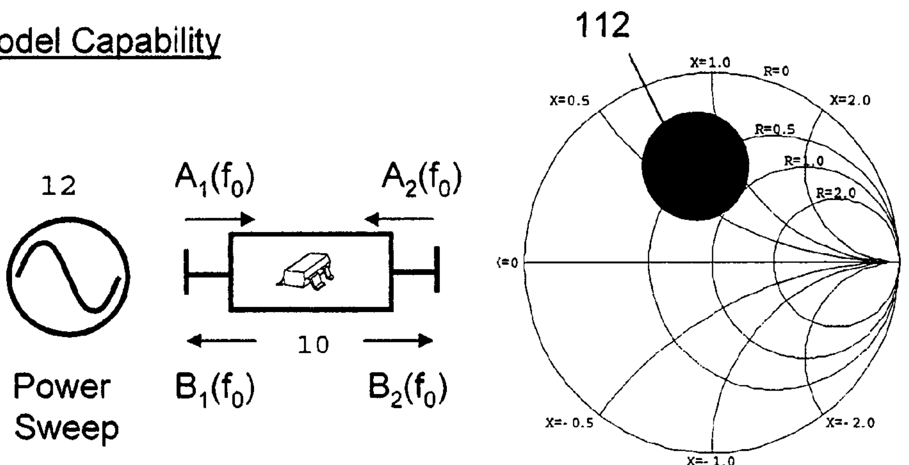
FIG. 14 represents the behavioral model in a non-50 Ohm environment.

The set-up shown in FIG. 2 allows extracting in an automatic way a complete behavioral model at the fundamental frequency for a non-50 Ohm environment. The model has the capability to predict the reflected and transmitted wave as function of the incident waves for a power sweep at the input and equivalent load impedances, covering an area (112) on the Smith chart enclosed by a circle (see FIG. 14).

Figure 15A:
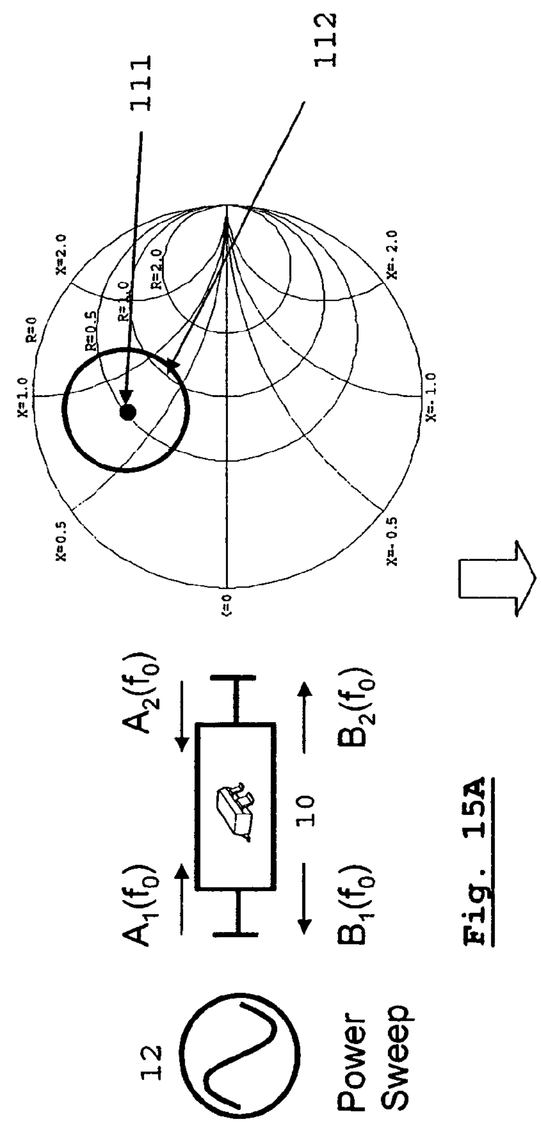
FIGS. 15A and 15B represent an impedance transformation at the output and impact on the behavioral model.
Figure 15B:
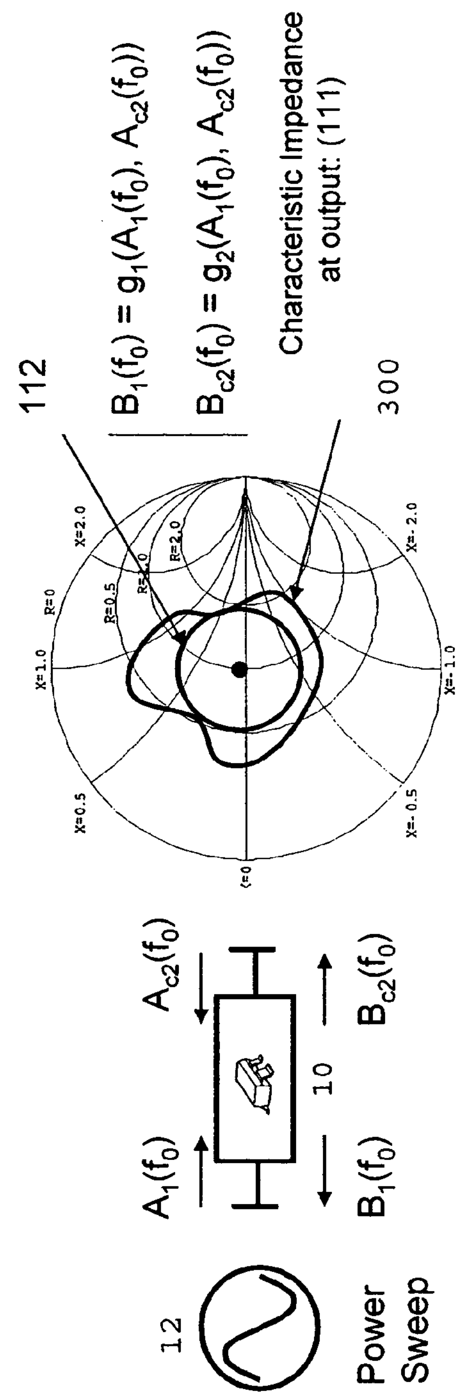
Figure 16:
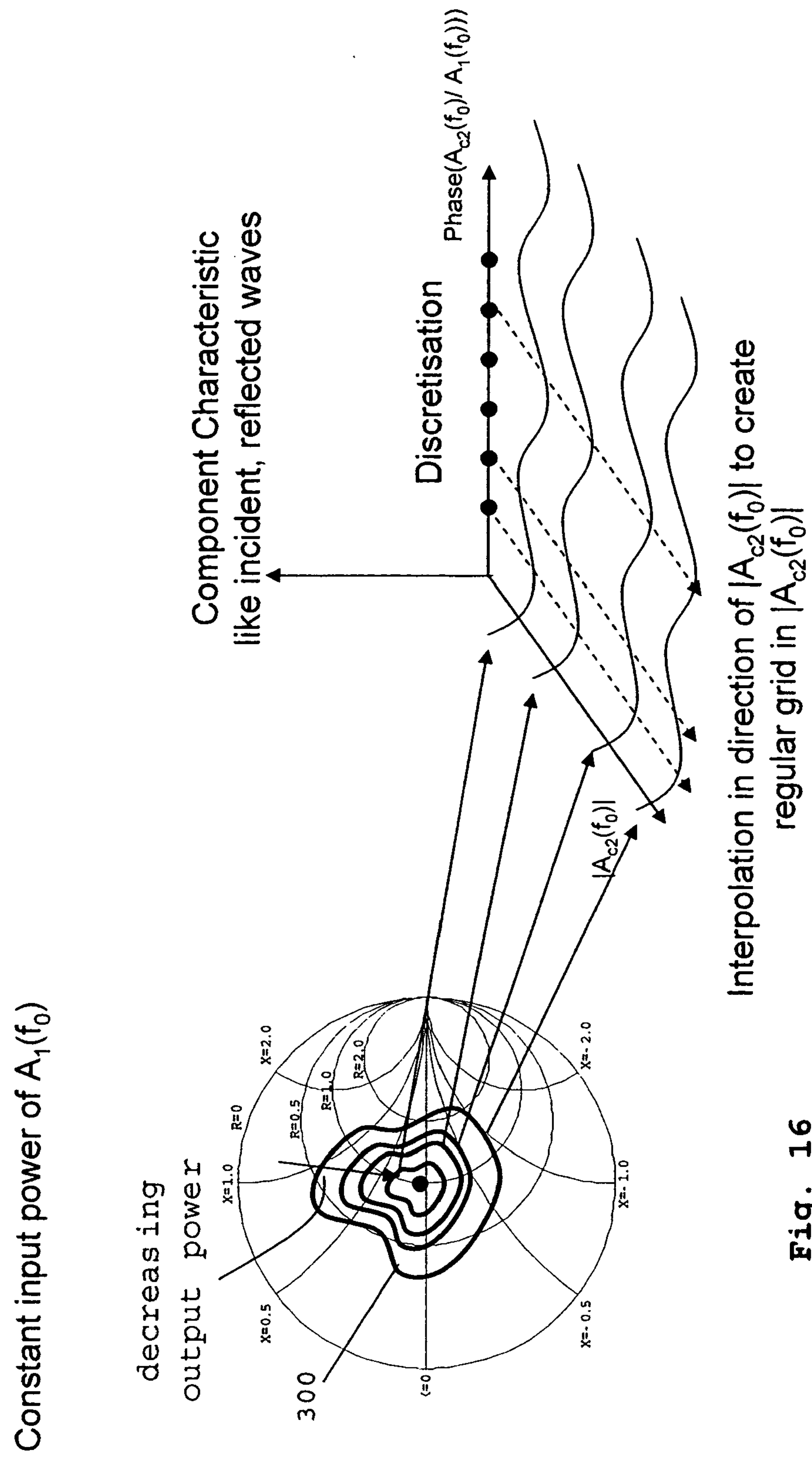
FIG. 16 represents process to create a table-based model, based on the discretisation of the independent variables.

First a characteristic impedance transformation is performed on the waves at the output ($A_2$, $B_2$) based on the center point (111) of the covered area (112) on the Smith chart (FIG. 15A). The center point (111) corresponds to characteristic impedance $Z_c$. After the impedance transformation the area is centered around the midpoint of the Smith chart (FIG. 15B). Then for each input power (obtained when sweeping the input power), the maximum output power of the second source (13) (FIG. 2) is determined, such that a set of equivalent impedances is synthesized larger or equal to the targeted circle. The impedance is synthesized with an active injection consisting of one tone, which is offset from the input source frequency (simplified—no amplitude modulation—smart active load-pull). This automatic synthesis creates a closed loop (300) of impedances covering at least the area of interest (112). Because of this approach, one measures an incident wave $A_{c2}(f_0)$, the phase of which is a continuous function in relation to the incident wave at the input $A_1(f_0)$ (closed loop (300)). As a function of that phase the amplitude of $A_{c2}(f_0)$ changes, as can be seen in FIG. 15B. Then the output source amplitude is decreased step by step, while keeping the input power $A_1$ constant. This results in a series of closed loops on the Smith chart, smaller than the first one (FIG. 16). Meanwhile all incident and reflected waves are measured, capturing the complete state of the device, as function of the amplitude and the phase of $A_{c2}(f_0)$ for a constant input power. The maximum value of $A_{c2}(f_0)$ is chosen to cover the selected area on the Smith chart.

It is now very easy to build a measurement-based model with a regular grid in the independent variables $|A_1(f_0)|$, $|A_{c2}(f_0)|$ and the phase of $(A_{c2}(f_0)/A_1(f_0))$. The goal is to be able to predict the reflected wave and transmitted wave as a function of the incident waves. Based on the measurements, shown on FIG. 16, it is possible to select a regular grid in the phase of $(A_{c2}(f_0)/A_1(f_0))$, because this is a continuous function. It is possible to create a regular grid in $|A_{c2}(f_0)|$ by interpolating between the measurement characteristics (in other words, reflected and transmitted wave) for a given phase of $(A_{c2}(f_0)/A_1(f_0))$ in the direction of $|A_{c2}(f_0)|$. The interpolation can be done on the real and imaginary part of the measurements or on the amplitude and phase. This results into a table-based model (FIG. 17), which can easily be connected to a simulation tool.

Figure 18:
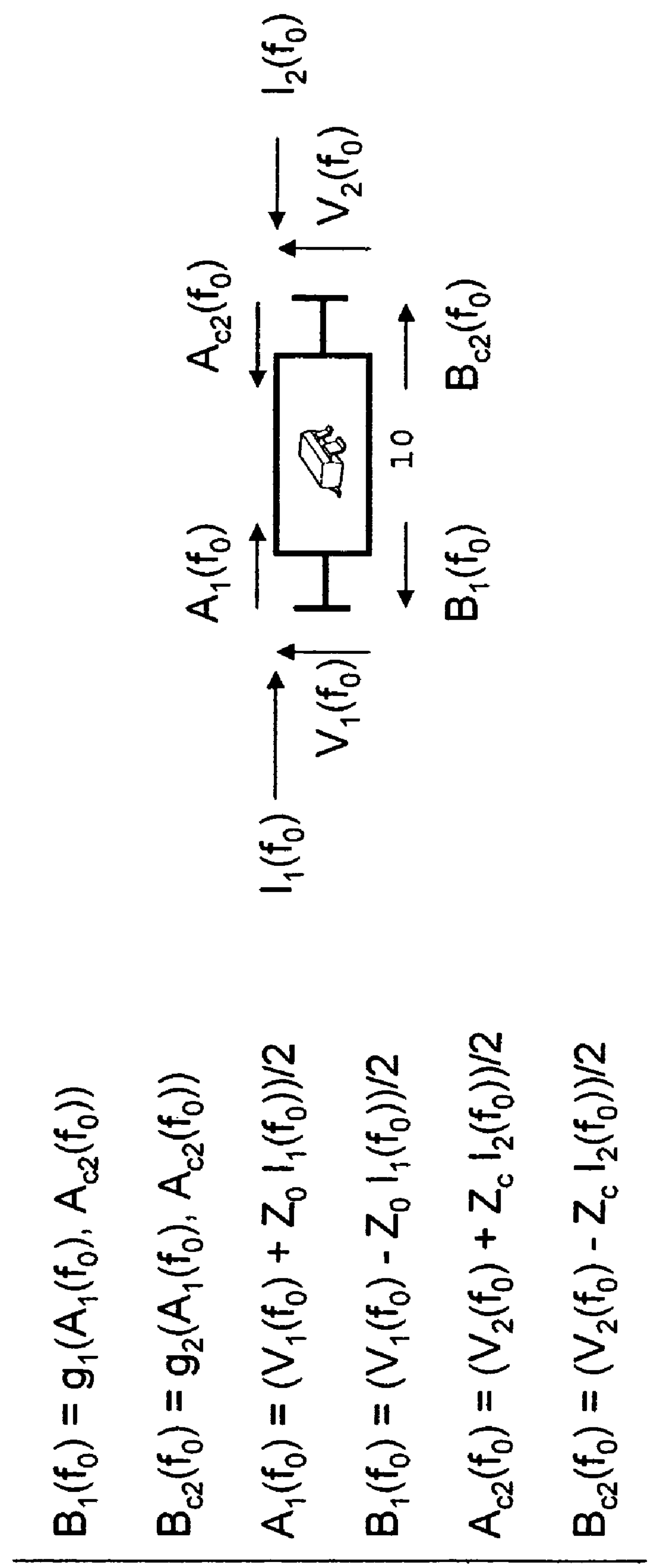
FIG. 18 represents a measurement-based behavioral model in a simulator.

Simulators usually work in the voltage and current formalism. The simulation capability to solve non-linear equations is used to solve the set of non-linear equations, representing the model and making the link with voltages and currents (FIG. 18).

Figure 20:
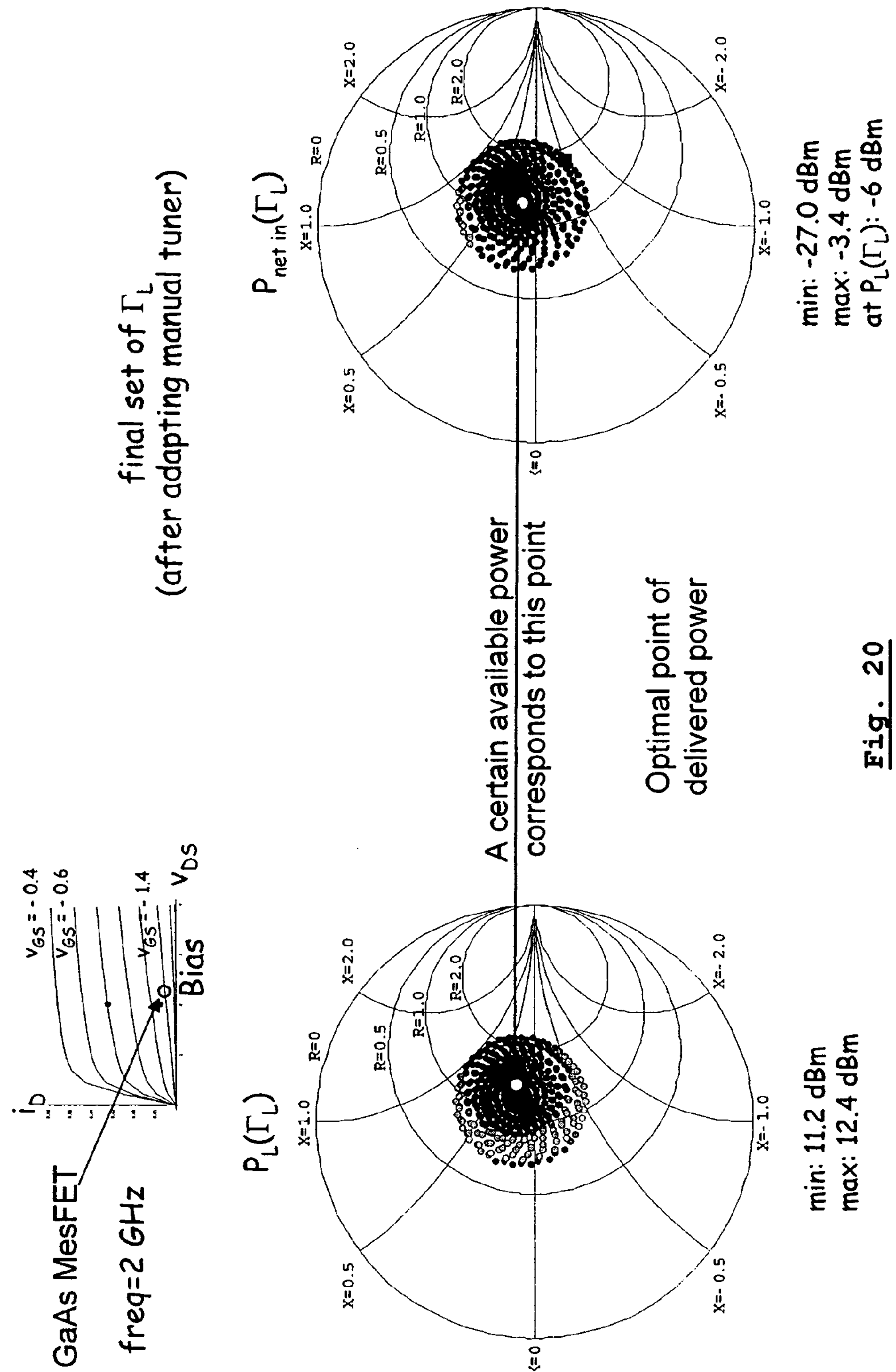
FIG. 20 represents the characteristics after tuning with optimal delivered power.
Figure 21:
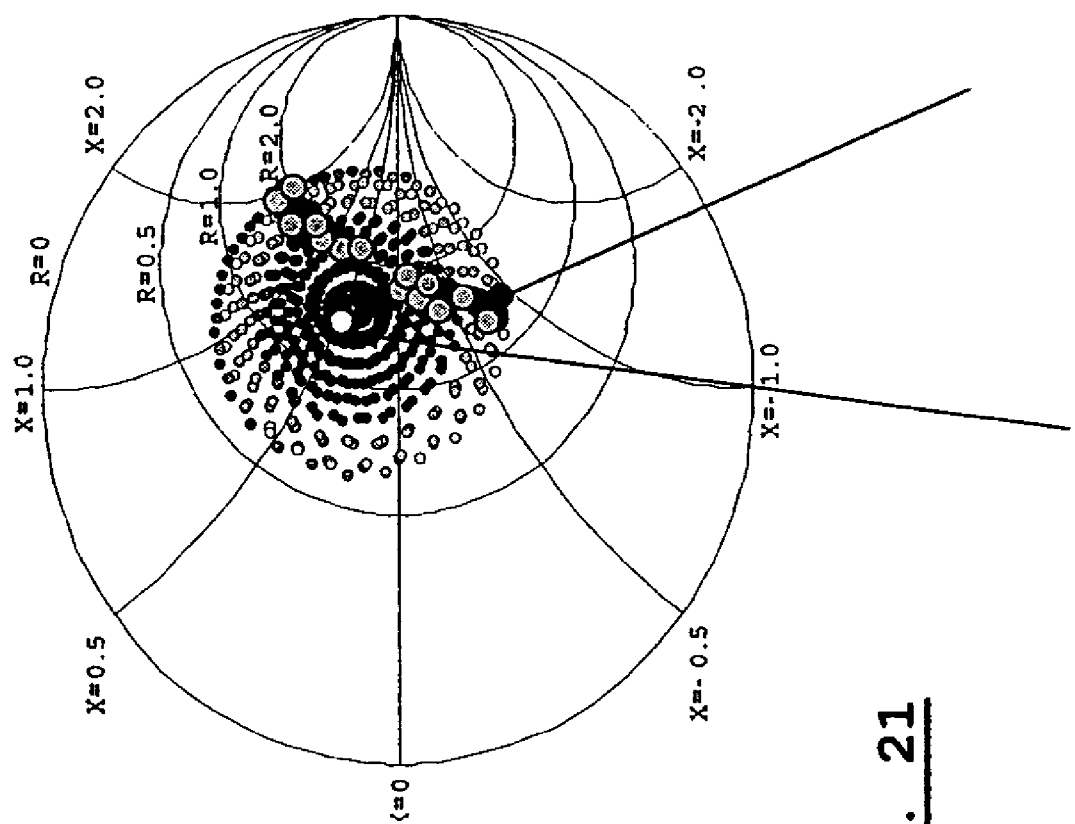
FIG. 21 represents the tuning process to map requested available power onto the optimal delivered power.

Finally an example is given of the characterization of a device under test, wherein the optimal source and load impedance of a commercial available GaAs MESFET are determined with the methodology explained above. The set-up, shown in FIG. 2, is used without the pre-matching tuners (14) but with a manual passive tuner (16) at the output. The second signal generating source (13) is used to synthesize all load states at once as indicated on FIG. 19. It cannot be seen whether the optimal delivered power to the load is achieved, because the maximal delivered power is on the edge of the generated load impedances. The manual tuner is then positioned while monitoring the resulting changes on the smith chart until the results of FIG. 20. The optimal delivered power has been achieved this time because the maximal point is within the generated load impedances. However, the net power delivered to the device for that optimal point could be different from the requested available power. In this case, the power of the input source (FIG. 2) is changed until the optimal point coincides with the given available power. To help this tuning process a representation is used as shown in FIG. 21. This representation allows straightforward tuning to the optimal point. The point with maximum delivered power is displayed in combination with the selected points, which correspond to the requested available power. The source is then tuned in power until one of the selected 'available power' points corresponds to the point of optimal delivered power.

CONCLUSION

While specific blocks, sections, devices, functions and modules may have been set forth above, a skilled technologist will realize that there are many ways to partition the system, and that there are many parts, components, modules or functions that may be substituted for those listed above.

While the above detailed description has shown, described, and pointed out the fundamental novel features of the invention as applied to various embodiments, it will be understood that various omissions and substitutions and changes in the form and details of the system illustrated may be made by those skilled in the art, without departing from the intent of the invention.

What is claimed is:

1. A measurement system for determining at least one characteristic of a device under test (DUT) at at least one frequency, the at least one characteristic being a function of time, the measurement system comprising a network analyzer being in connection at least with generator means for generating a first and second frequency component, at least the second frequency component being offset from the at least one frequency at which the DUT is characterized, the network analyzer further comprising signal paths applying the generated first and second frequency components to the DUT and receiving signals from the DUT, the measurement system obtaining a power sweep or a changing and repetitive load impedance at an input or an output of the DUT, whereby the network analyzer further comprises a data acquisition and processing unit calculating from the received signals from the DUT the at least one characteristic as a function of time and a combination of a source match and an available power or a changing and repetitive load impedance as a function of time, such that the characteristic as a function of time can be mapped to a combination of the source match and the available power or to the load impedance.

2. The measurement system as in claim 1, wherein the at least one characteristic belongs to the group comprising DUT input impedance, gain, net input power, and delivered output power.

3. The measurement system as in claim 1, wherein the generator means is a vector signal generator.

4. The measurement system as in claim 1, further comprising at least one pre-match tuner.

5. The measurement system as in claim 1, wherein the network analyzer is in connection with a passive tuner.

6. The measurement system as in claim 1, wherein the network analyzer is a large-signal network analyzer.

7. The measurement system as in claim 1, wherein the DUT has a non-linear behavior.

8. The measurement system as in claim 1, wherein the DUT is a two-port device.

9. The measurement system as in claim 1, wherein the DUT is an N-port device.

10. The measurement system as in claim 9, wherein at each port a plurality of vector signal generators is provided.

11. The measurement system as in claim 10, wherein at each port a passive tuner is provided between the network analyzer and each vector signal generator of the plurality of vector signal generators.

12. A system for analyzing a device under test (DUT), the system comprising:

the measurement system of claim 1, the measurement system being connected to the DUT; and a simulator tool comprising a simulation circuit, the simulation circuit comprising the DUT, the simulator tool being arranged for communicating with the measurement system.

13. The measurement system as in claim 1, wherein the generator means comprises a first source and a second source.

14. The measurement system as in claim 13, wherein the first and the second source are synthesizers sharing a same reference clock.

15. The measurement system as in claim 13, wherein the frequency content generated by the second source comprises a periodic amplitude modulated tone.

16. The measurement system as in claim 1, wherein the first and second frequency component have an offset +df and −df, respectively, from the at least one frequency at which the DUT is characterized.

17. The measurement system as in claim 1, wherein the network analyzer maps the determined characteristic onto the source match and available power combination or onto the load impedance.

18. A method for determining at least one characteristic of a device under test (DUT) at a given frequency, wherein the method is used with a measurement system comprising a network analyzer being in connection at least with generator means for generating a first and second frequency component, at least the second frequency component being offset from the at least one frequency at which the DUT is characterized, the network analyzer further comprising signal paths arranged for applying the generated first and second frequency components to the DUT and arranged for receiving signals from the DUT, the measurement system being arranged for obtaining a power sweep or a changing and repetitive load impedance at an input or an output of the DUT, whereby the network analyzer further comprises a data acquisition and processing unit configured to calculate from the received signals from the DUT the at least one characteristic as a function of time and a combination of a source match and an available power or a changing and repetitive load impedance as a function of time, such that the characteristic as a function of time can also be represented as a function of the combination of the source match and the available power or the load impedance, the method comprising:

a) defining on a Smith chart an area where the characteristic of the DUT is to be determined;

b) generating a first frequency component at the given frequency;

c) generating a periodic amplitude modulated signal with a carrier frequency offset from the first frequency component;

d) measuring with the measurement system voltages and currents at one or more device ports, while the signals generated in b) and c) are applied;

e) determining the at least one characteristic at the given frequency as a function of time, using the measured voltages and currents;

f) calculating the impedance at the output of the DUT as a function of time, using the measured voltages and currents; and g) mapping the determined characteristic onto the calculated impedance.

19. The method for determining at least one characteristic as in Claim 18, wherein the area comprises a center point that can be moved around by tuning a passive tuner.

20. A method for determining at least one characteristic of a device under test (DUT) at a given frequency, the method comprising:

providing a measurement system comprising a network analyzer to which a generator means for generating a first and a second frequency component is directly connected, the first and second frequency component having an offset +df and −df, respectively, from the given frequency, the network analyzer further comprising signal paths configured to apply the generated first and second frequency component to an input of the DUT and to receive signals output from the DUT;

measuring with the measurement system voltages and currents at one or more device ports for each power setting;

determining the at least one characteristic at the given frequency as a function of time using the measured voltages and currents;

calculating a combination of a source impedance and available power at the input of the DUT; and mapping the determined characteristic onto the calculated source impedance in combination with the available power.

* * * * *